US006408496B1

(12) United States Patent
Maynard

(10) Patent No.: US 6,408,496 B1
(45) Date of Patent: Jun. 25, 2002

(54) METHOD OF MANUFACTURING A VIBRATIONAL TRANSDUCER

(75) Inventor: Ron S. Maynard, San Jose, CA (US)

(73) Assignee: Ronald S. Maynard, Austin, TX (US)

( * ) Notice: Subject to any disclaimer, the term of this patent is extended or adjusted under 35 U.S.C. 154(b) by 0 days.

(21) Appl. No.: 09/094,442

(22) Filed: Jun. 10, 1998

Related U.S. Application Data

(60) Provisional application No. 60/052,040, filed on Jul. 9, 1997.

(51) Int. Cl.[7] .......................... H04R 17/10; H01L 41/18
(52) U.S. Cl. .......................... 29/25.35; 29/594; 29/847; 310/324
(58) Field of Search .................... 29/25.35, 594, 29/609.1, 847; 310/324, 331; 73/721, 727, 514.34; 600/25; 216/48

(56) References Cited

U.S. PATENT DOCUMENTS

| | | | | |
|---|---|---|---|---|
| 4,191,905 A | * | 3/1980 | Yasuda et al. | 29/25.35 |
| 4,642,508 A | * | 2/1987 | Suzuki et al. | 310/324 |
| 4,759,823 A | * | 7/1988 | Asselanis et al. | 216/48 |
| 5,165,289 A | | 11/1992 | Tilmans | |
| 5,188,983 A | | 2/1993 | Guckel et al. | |
| 5,338,929 A | | 8/1994 | Douma et al. | |
| 5,426,016 A | * | 6/1995 | Fujioka et al. | 216/48 |
| 5,458,000 A | | 10/1995 | Burns et al. | |
| 5,473,944 A | | 12/1995 | Kurtz et al. | |
| 5,553,506 A | | 9/1996 | Benz et al. | |
| 5,559,358 A | | 9/1996 | Burns et al. | |
| 5,914,507 A | * | 6/1999 | Polla et al. | 73/514.34 |

FOREIGN PATENT DOCUMENTS

| | | | | |
|---|---|---|---|---|
| JP | 58-34981 | * | 3/1983 | 29/25.35 |
| JP | 59-88618 | * | 5/1984 | 29/25.35 |
| JP | 06283951 | * | 10/1994 | 29/25.35 |
| JP | 06291590 | * | 10/1994 | 29/25.35 |
| JP | 06314947 | * | 11/1994 | 29/25.35 |

* cited by examiner

*Primary Examiner*—Peter Vo
*Assistant Examiner*—A. Dexter Tugbang
(74) *Attorney, Agent, or Firm*—Skjerven Morrill LLP

(57) ABSTRACT

A method for fabricating a vibrational transducer comprises providing a base structure, typically a material suitable for microfabrication. A cantilever beam is formed on a surface of the base structure, and is patterned into a desired geometry. The cantilever beam will be anchored at one end to the base structure and will have a free end which is capable of vibrating relative to the base structure. An inertial mass is formed at the free end of the cantilever beam, and the inertial mass is disposed to vibrate in a free space. An electrically conductive element is formed on the cantilever beam in he space between the anchored end and the free end. A fixed electrically conductive drive element is also formed on or over the base structure, adjacent to and spaced-apart from the electrically conductive element. A housing is formed over the base structure to seal the transducer so that it is suitable for implantation or other uses.

10 Claims, 24 Drawing Sheets

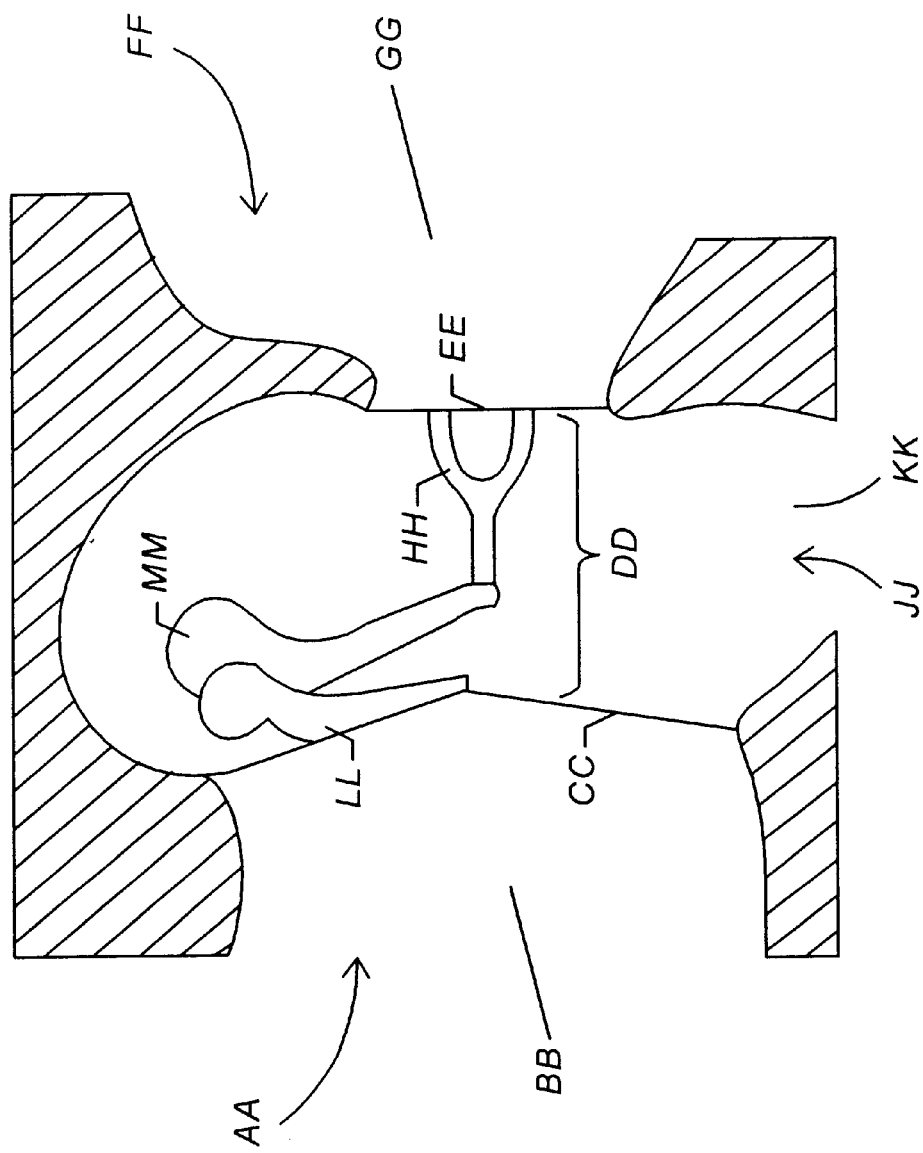
FIG_1

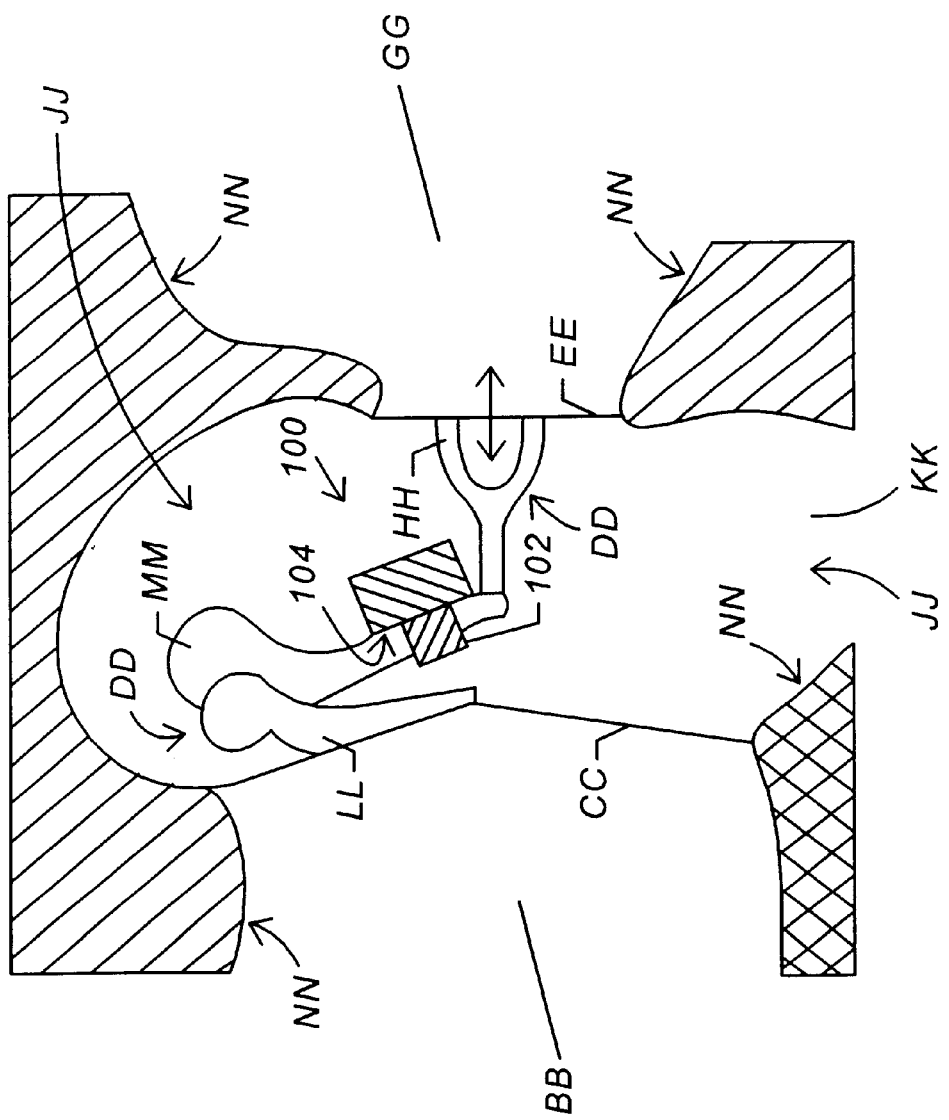
FIG_2A

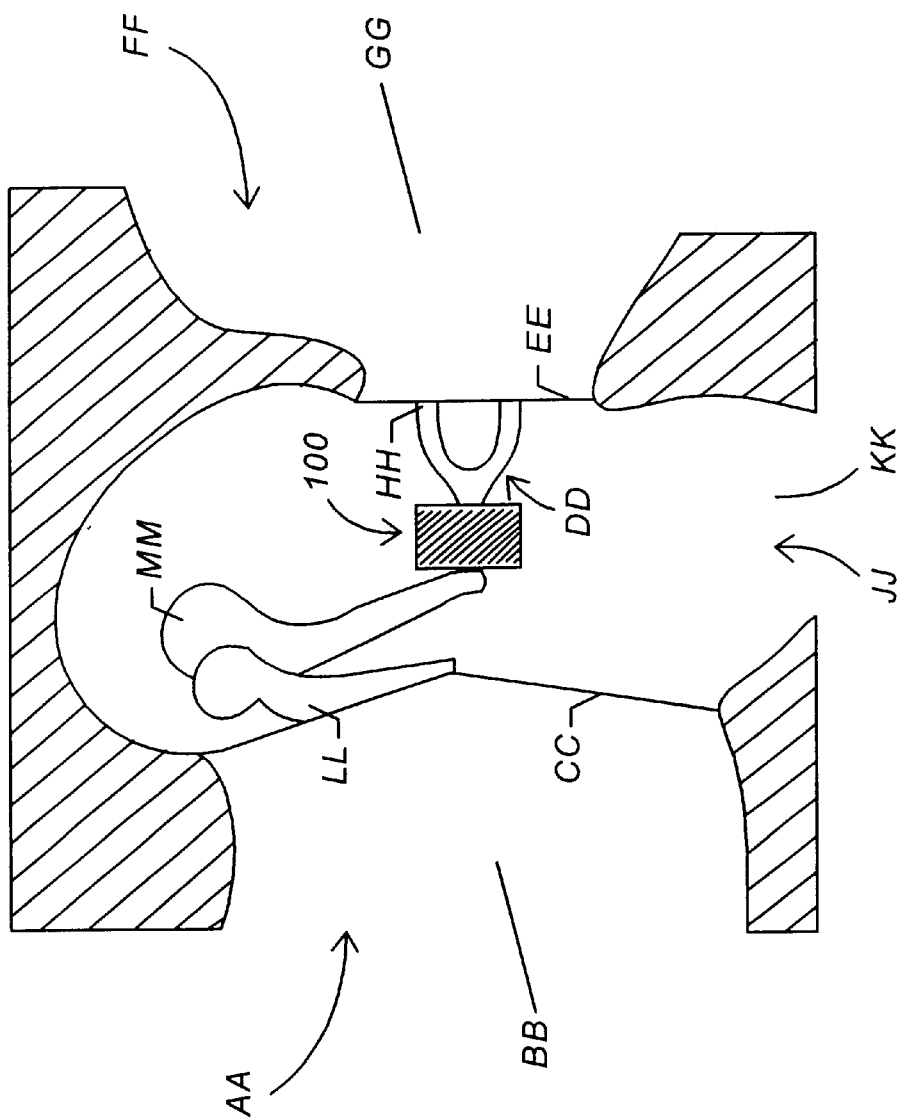
FIG_2B

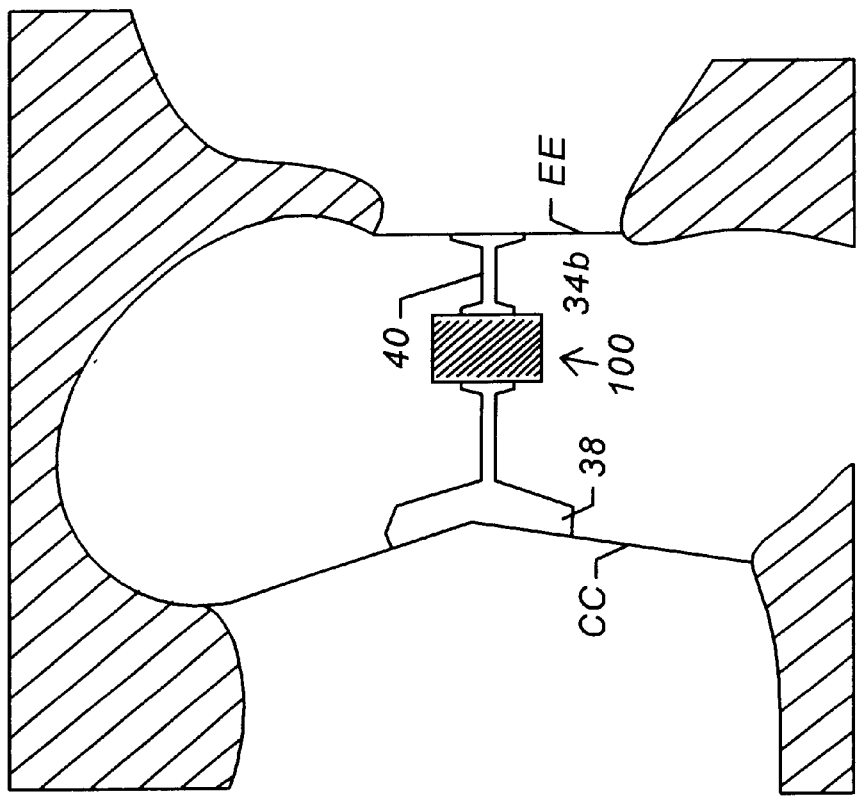
FIG_2C

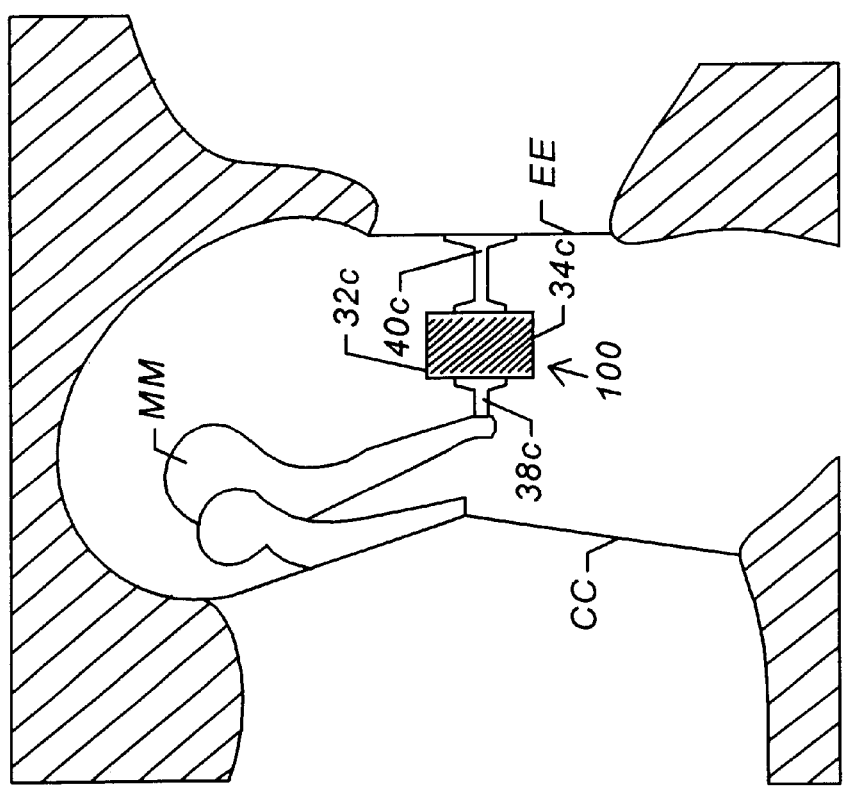
FIG_2D

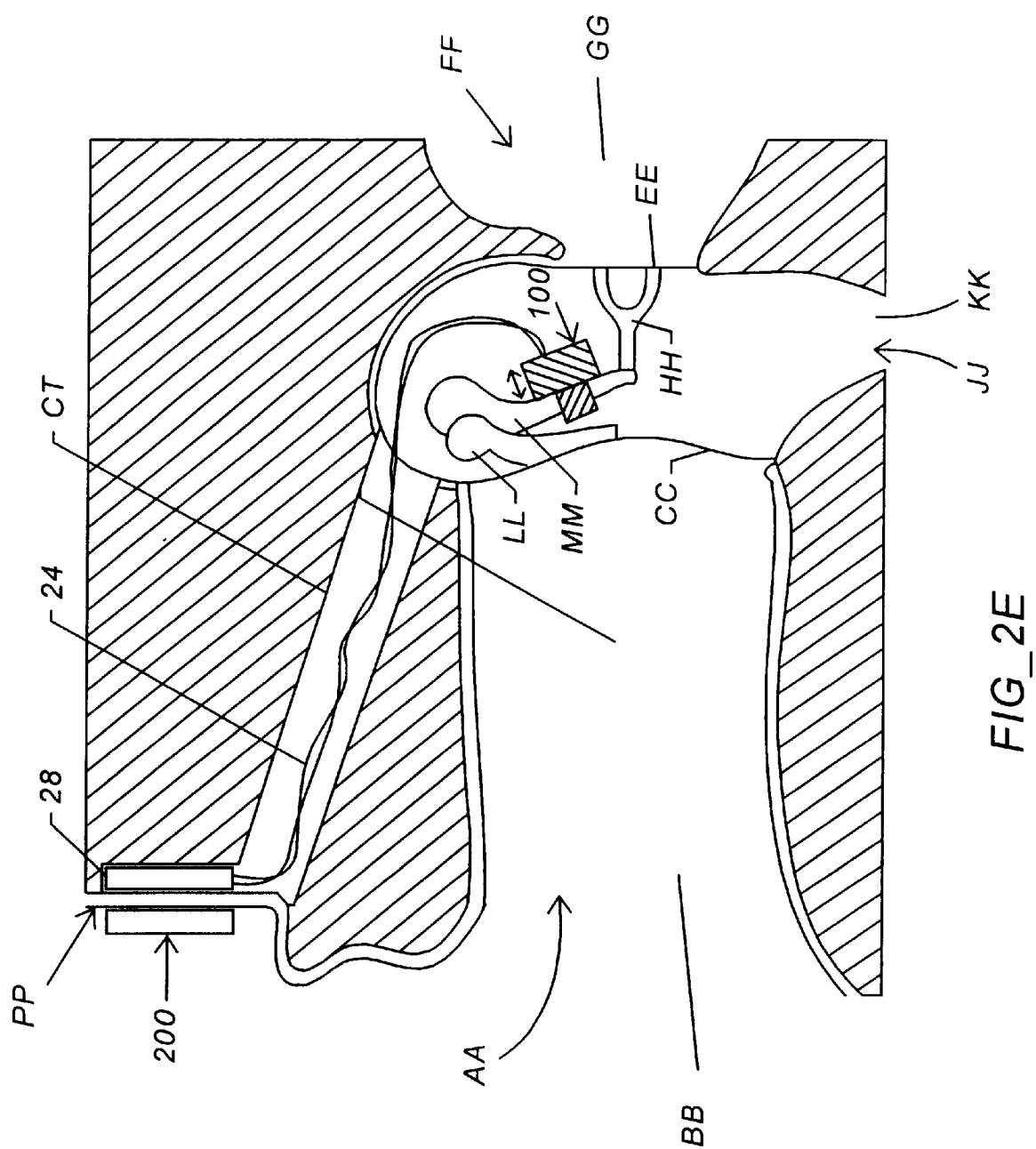
FIG_2E

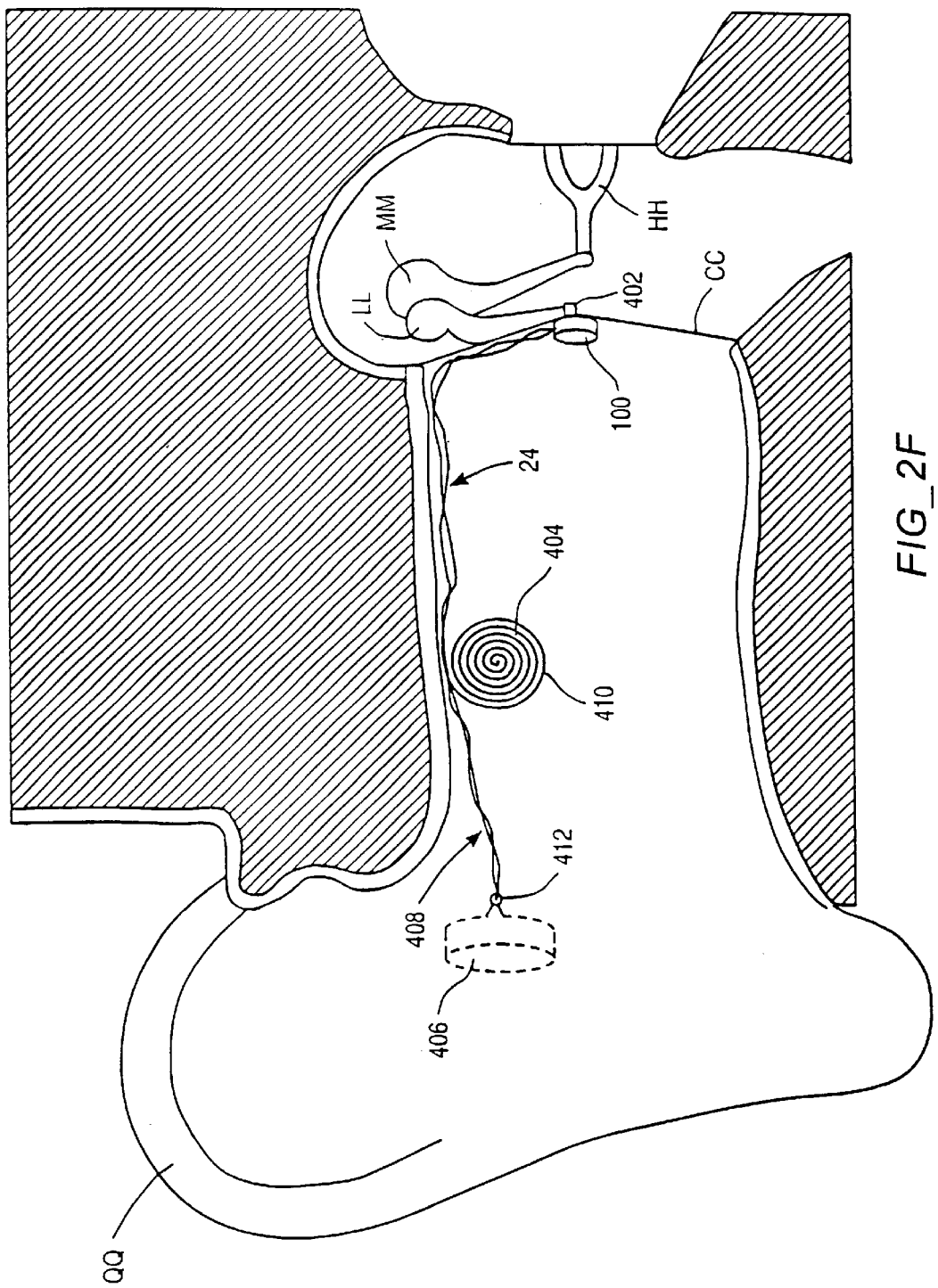
FIG_2F

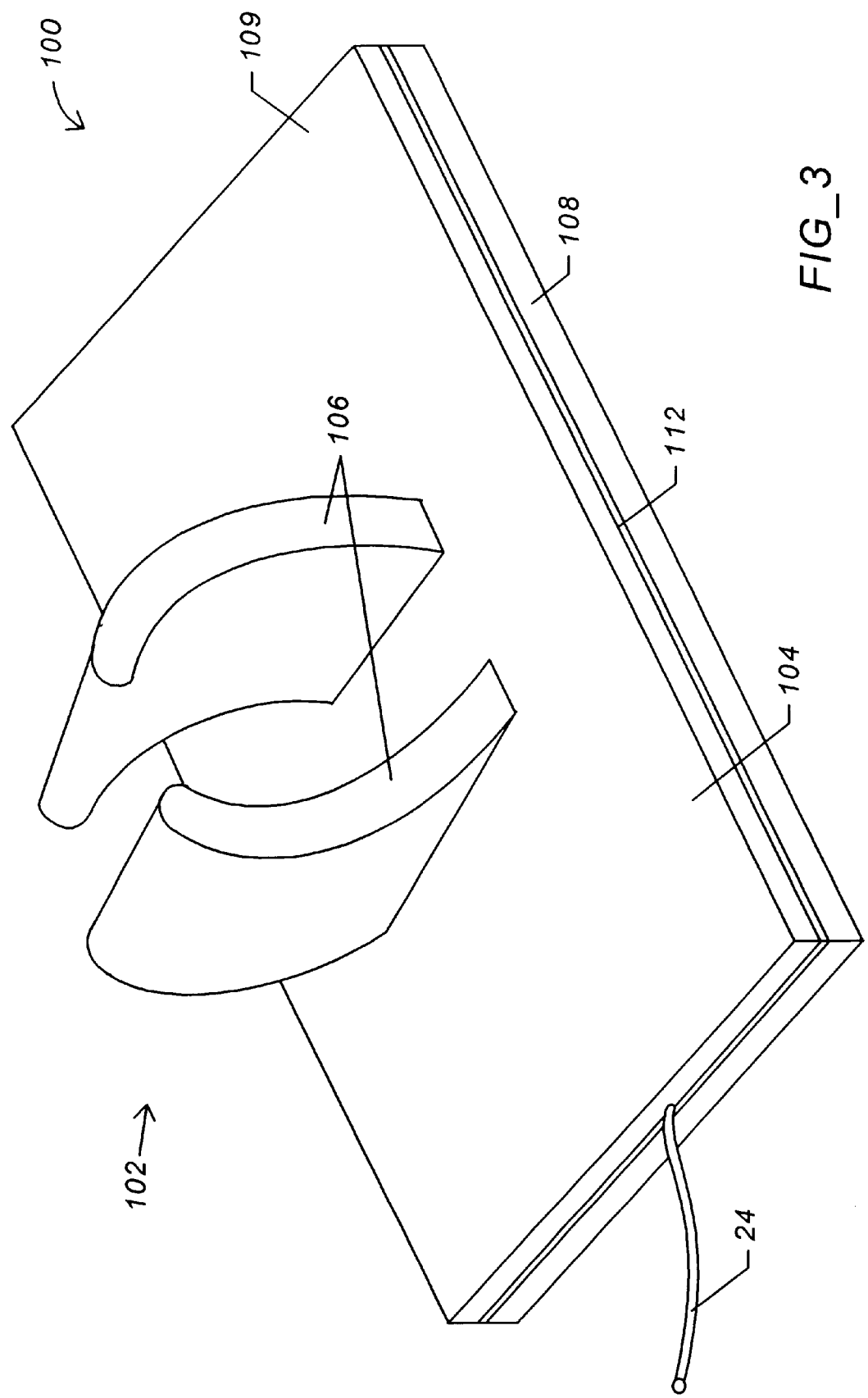
FIG_3

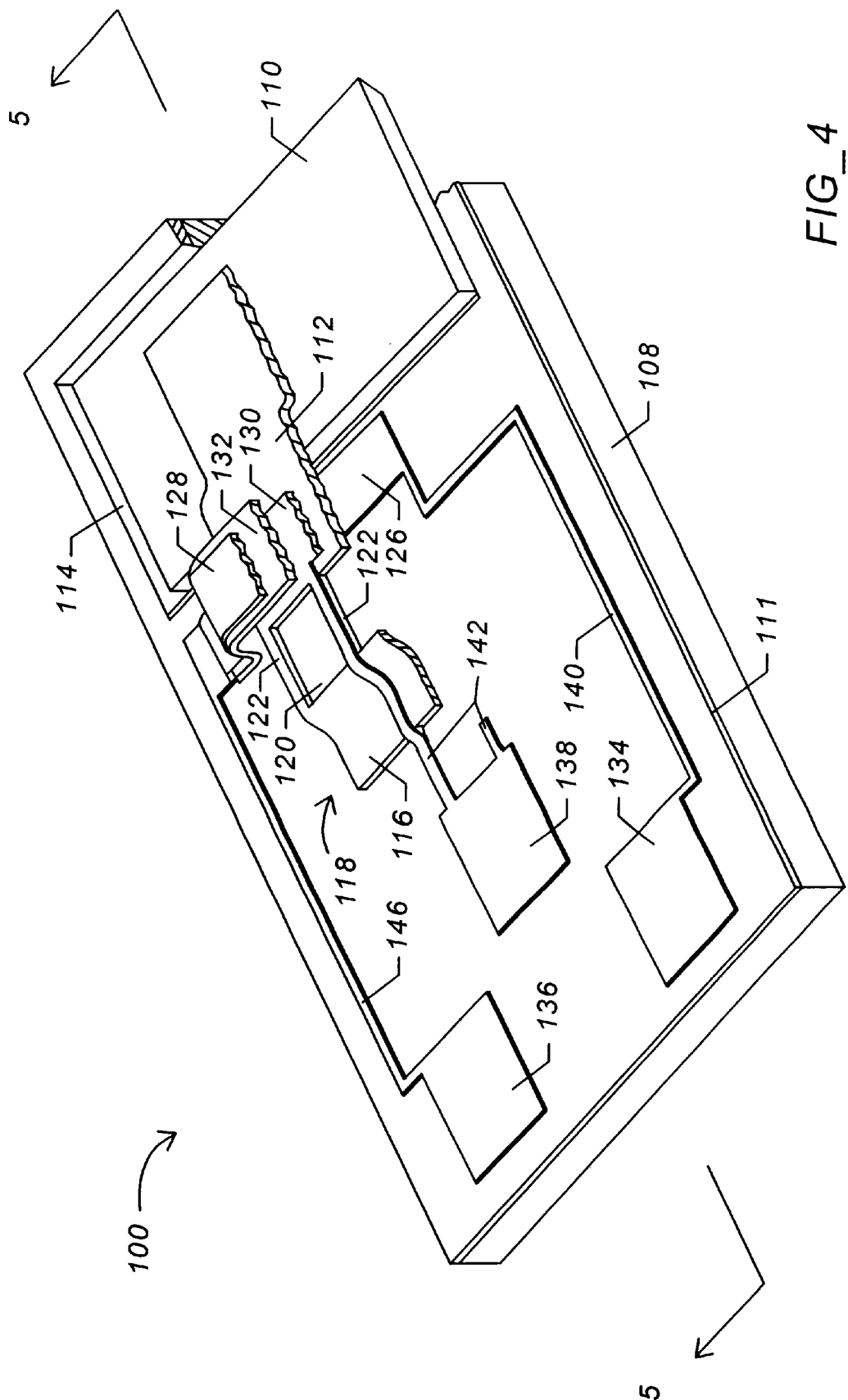

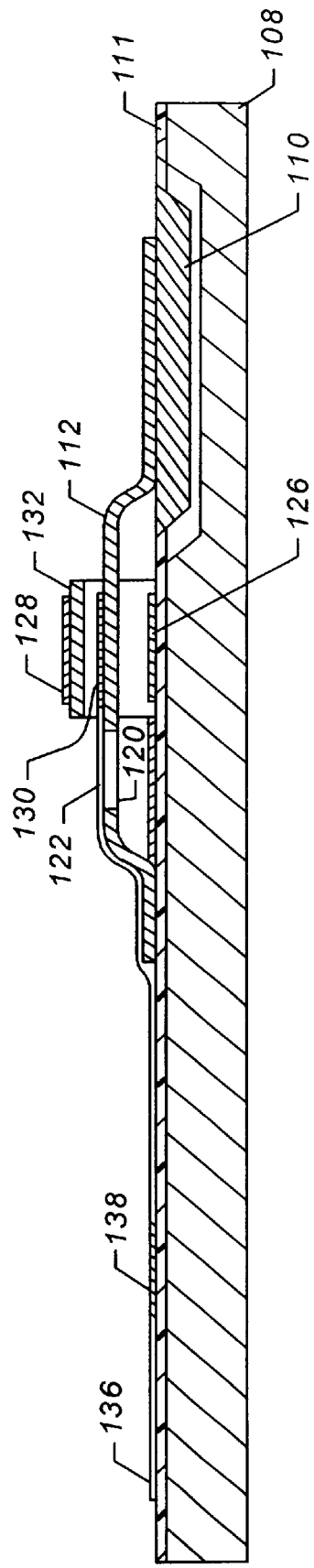
FIG_5

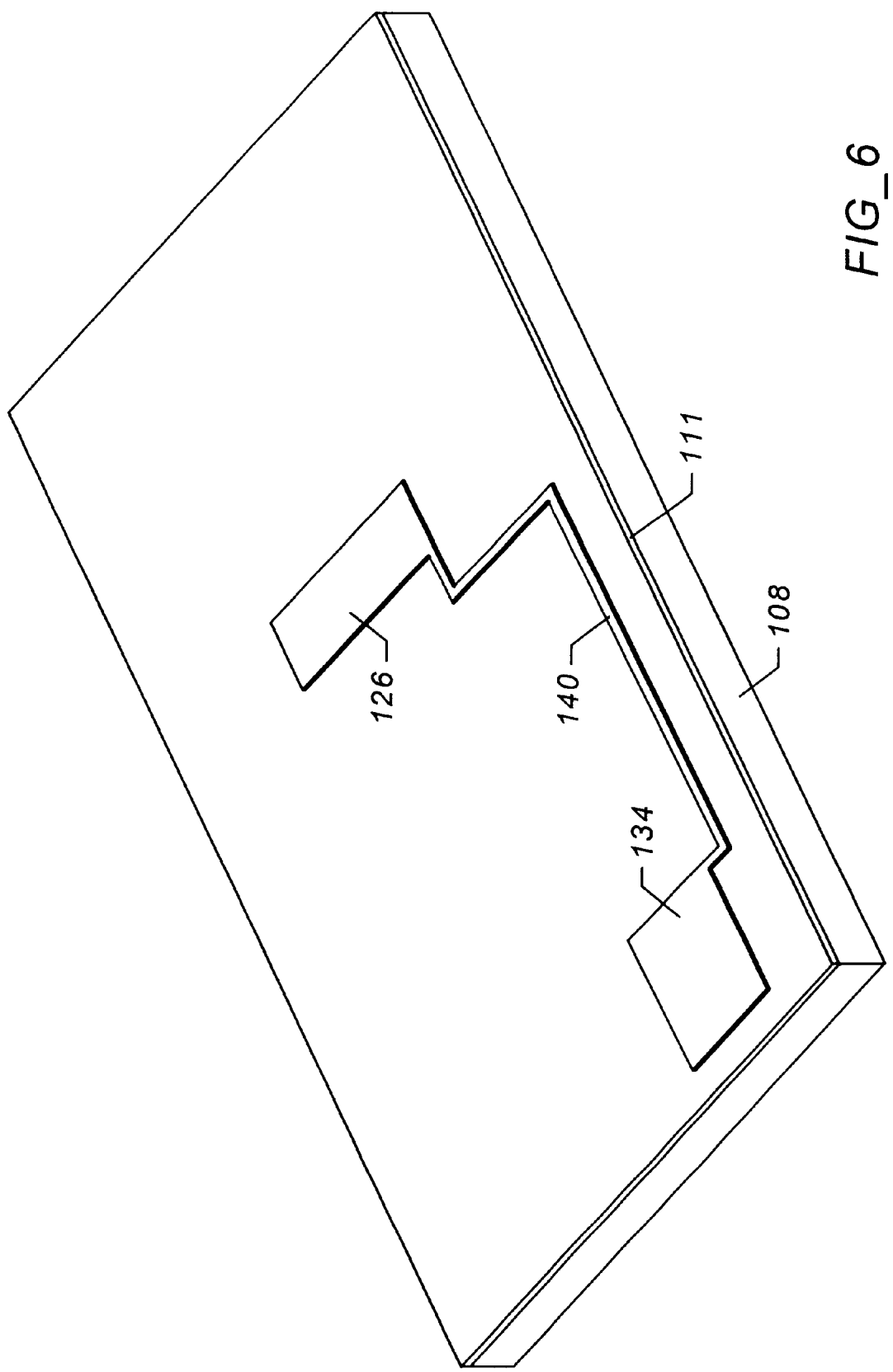
FIG_6

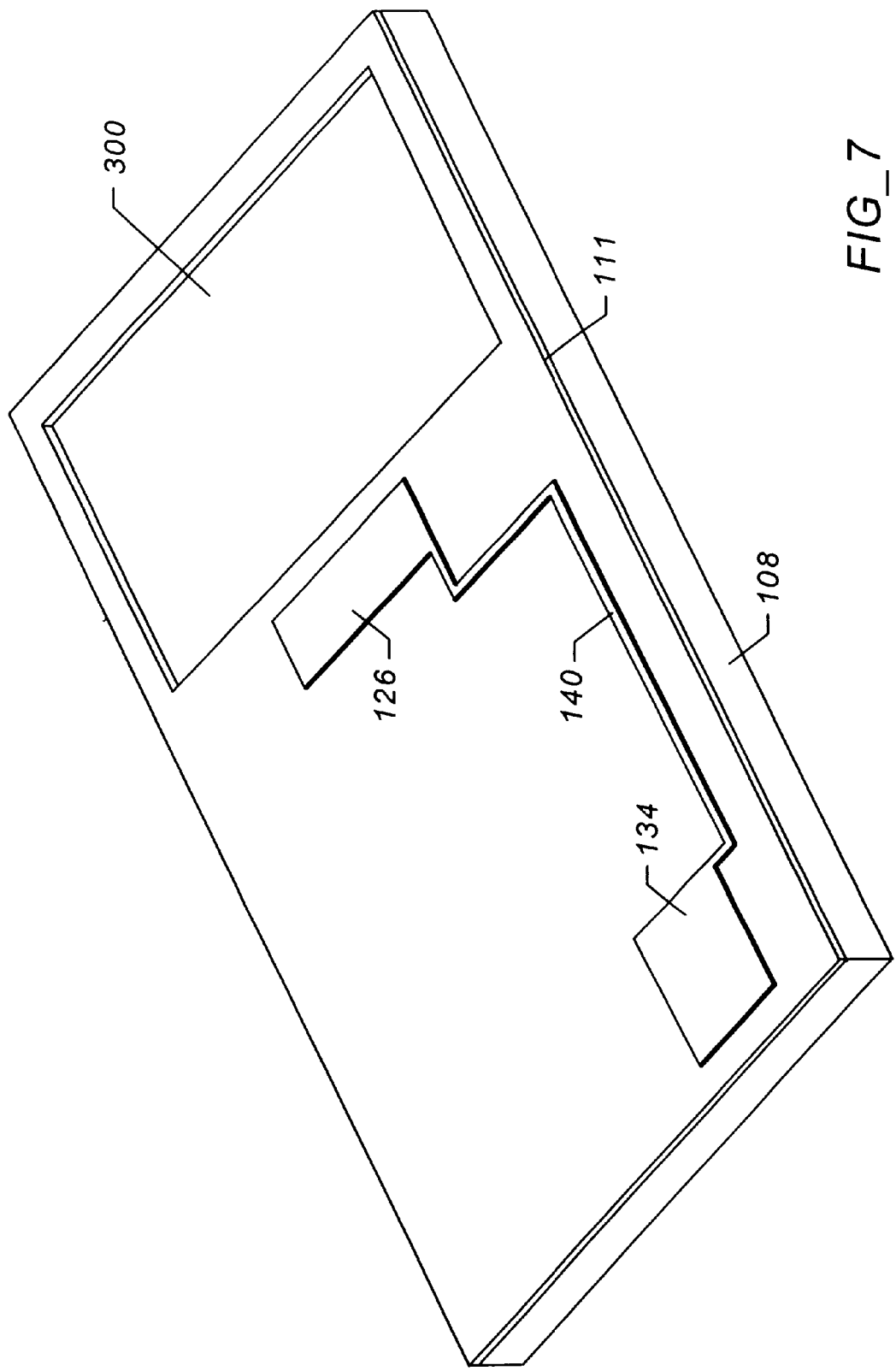
FIG_7

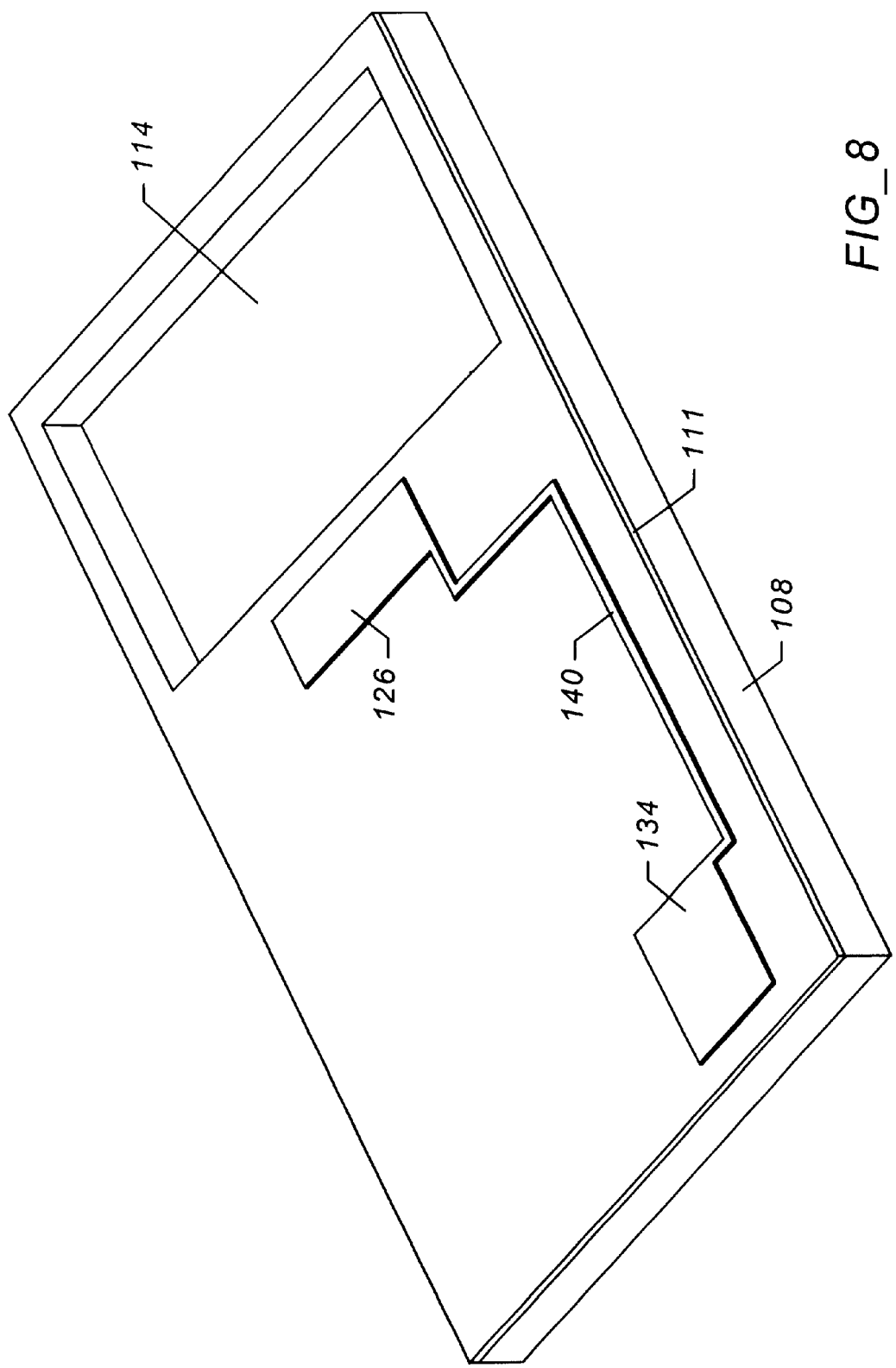
FIG_8

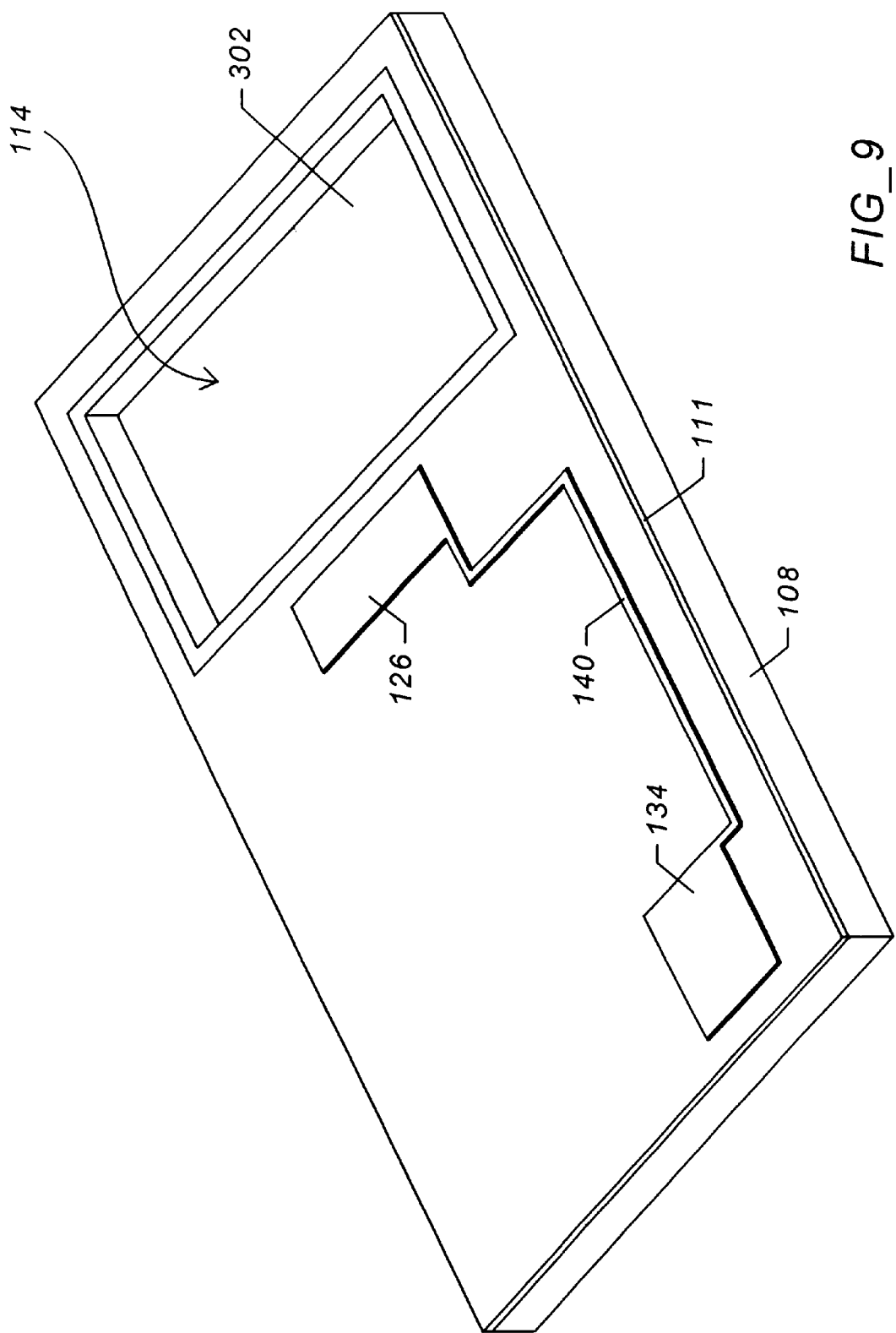
FIG_9

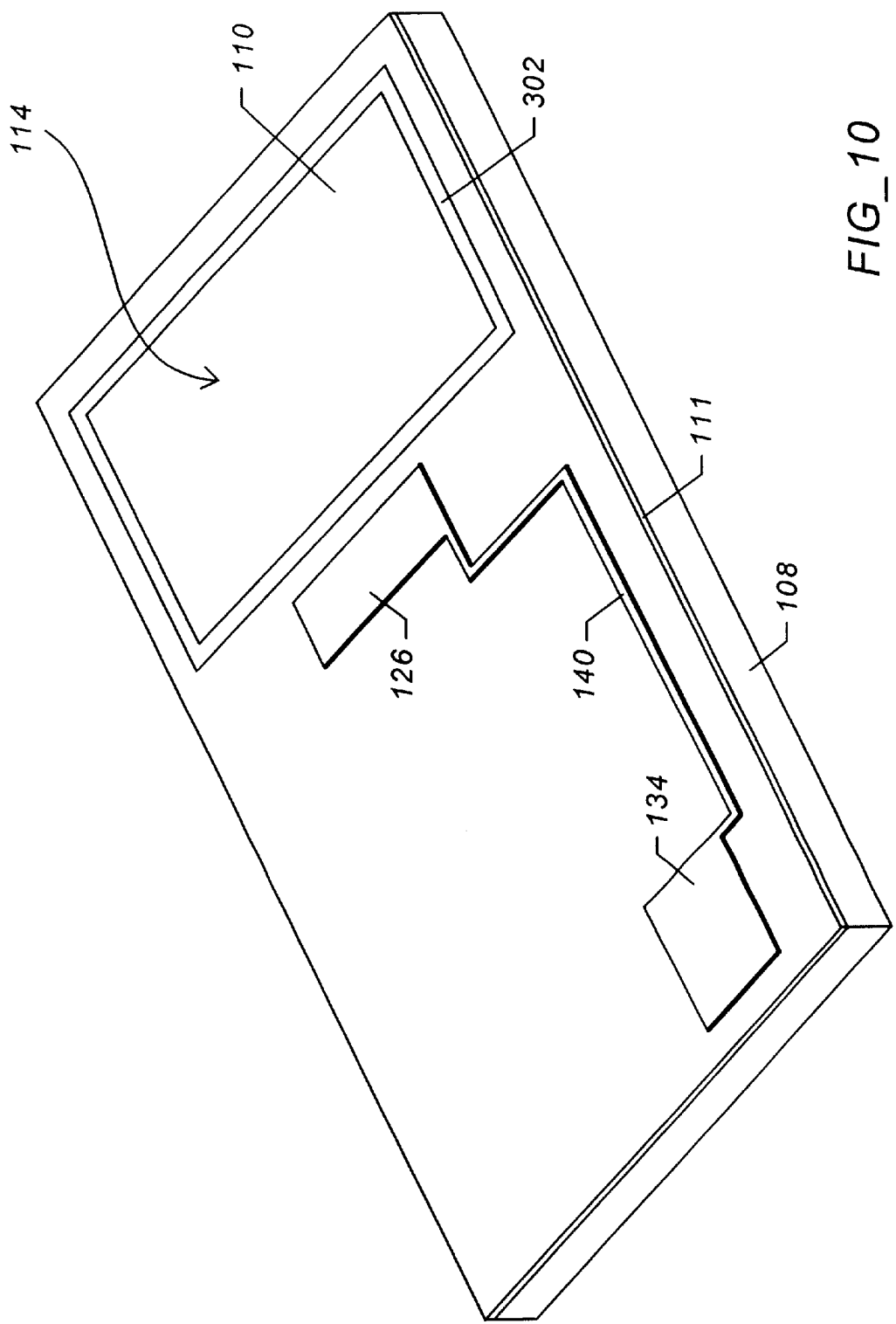
FIG_10

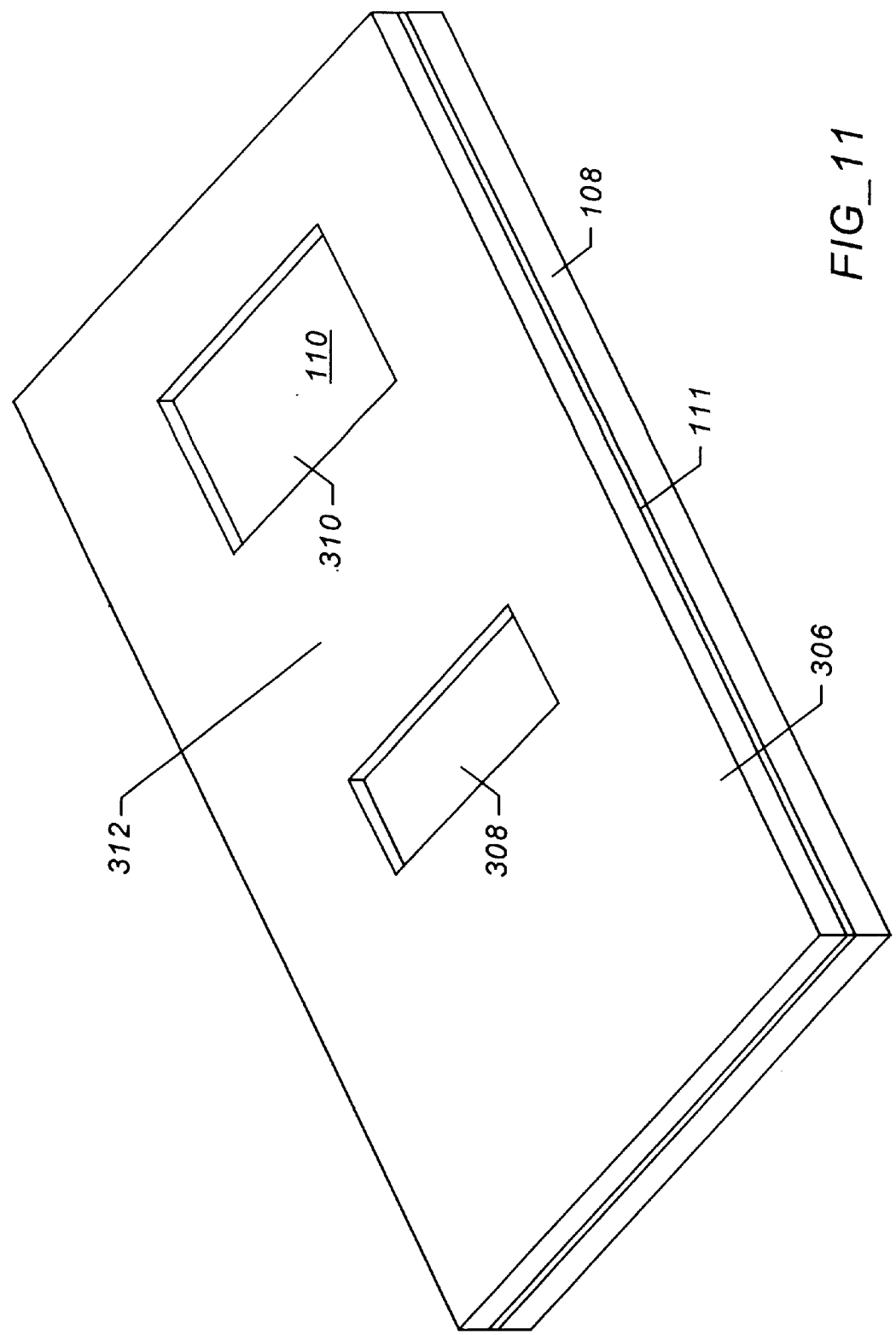
FIG_11

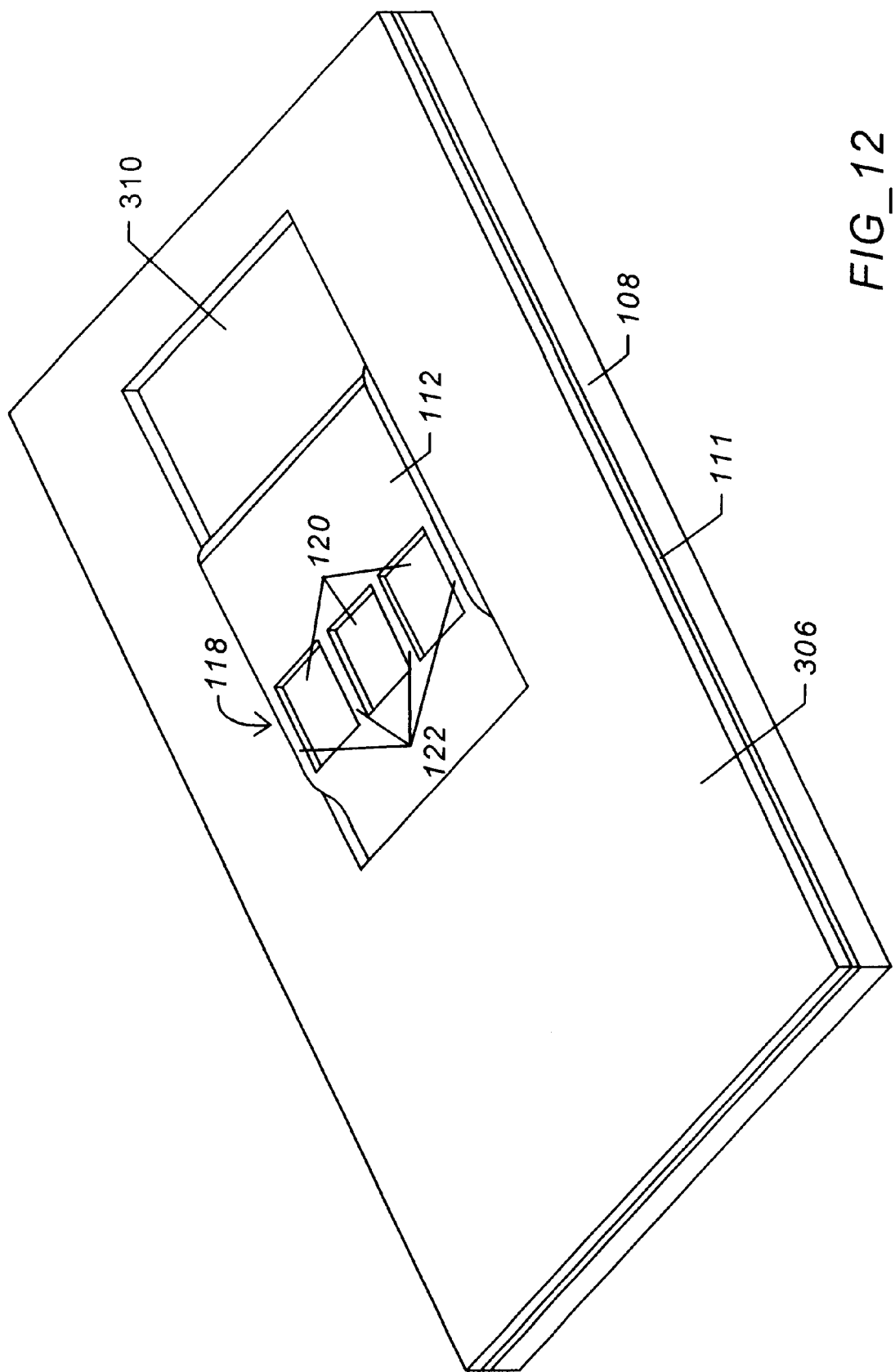
FIG_12

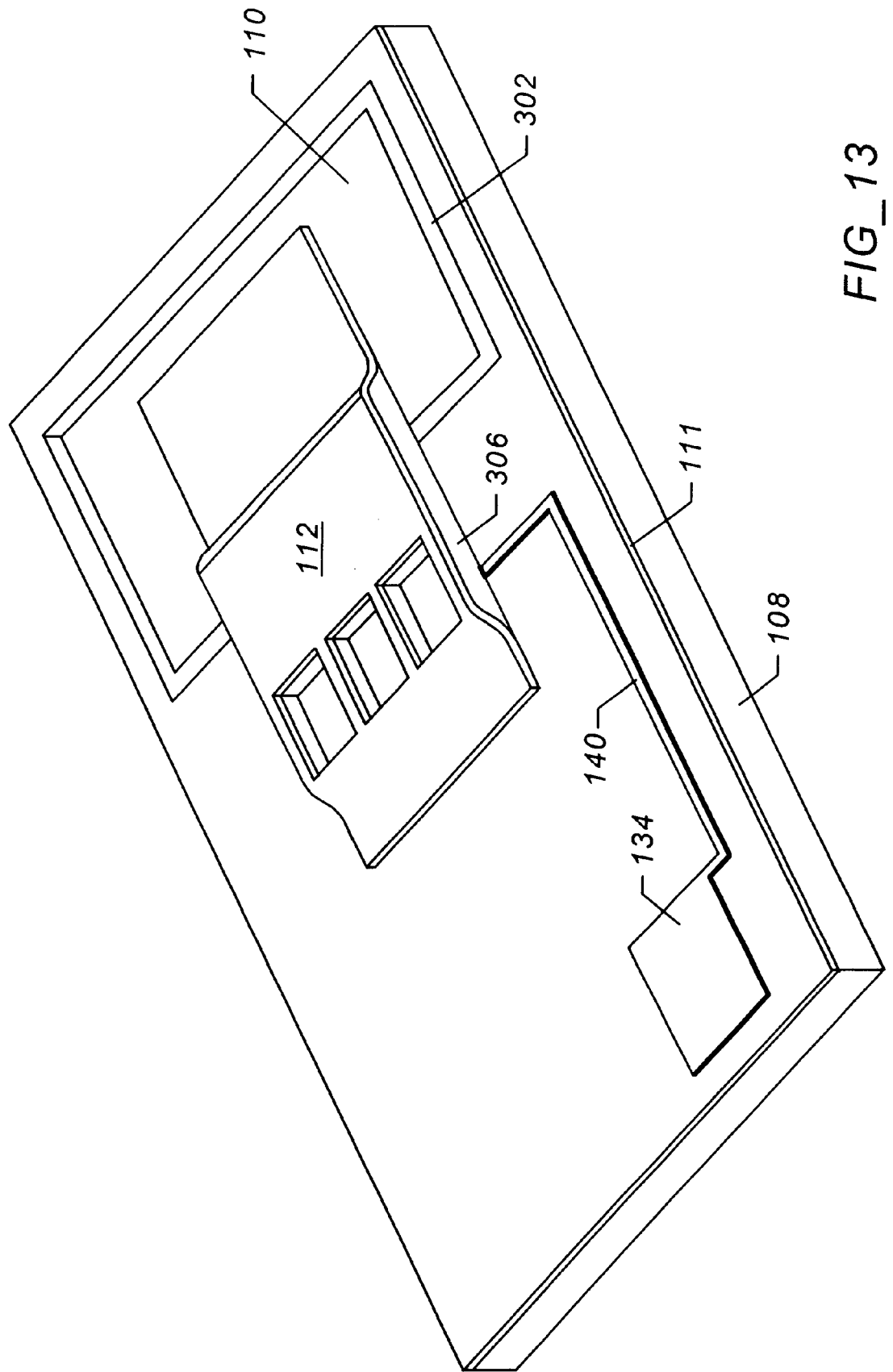
FIG_13

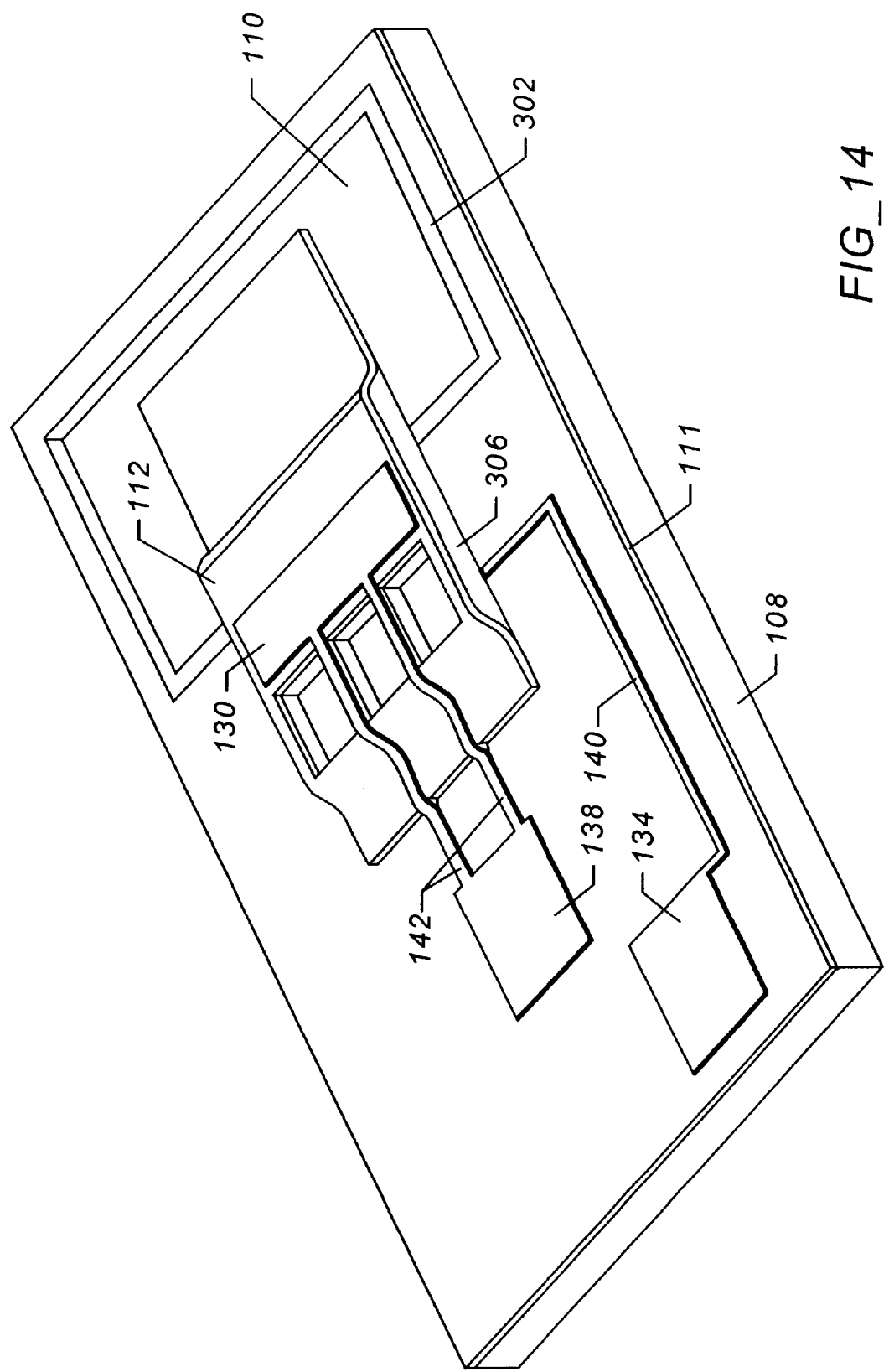
FIG_14

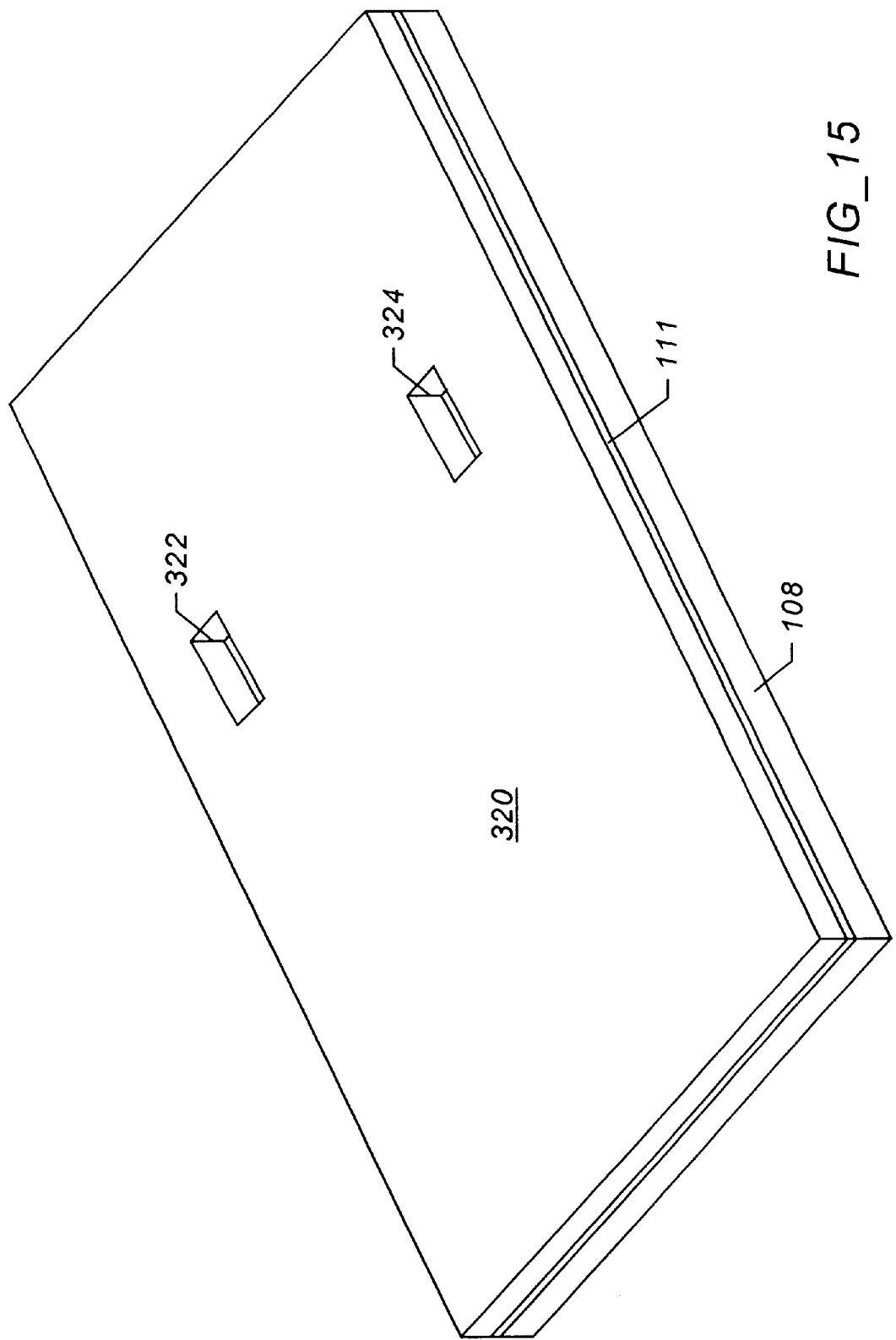
FIG_15

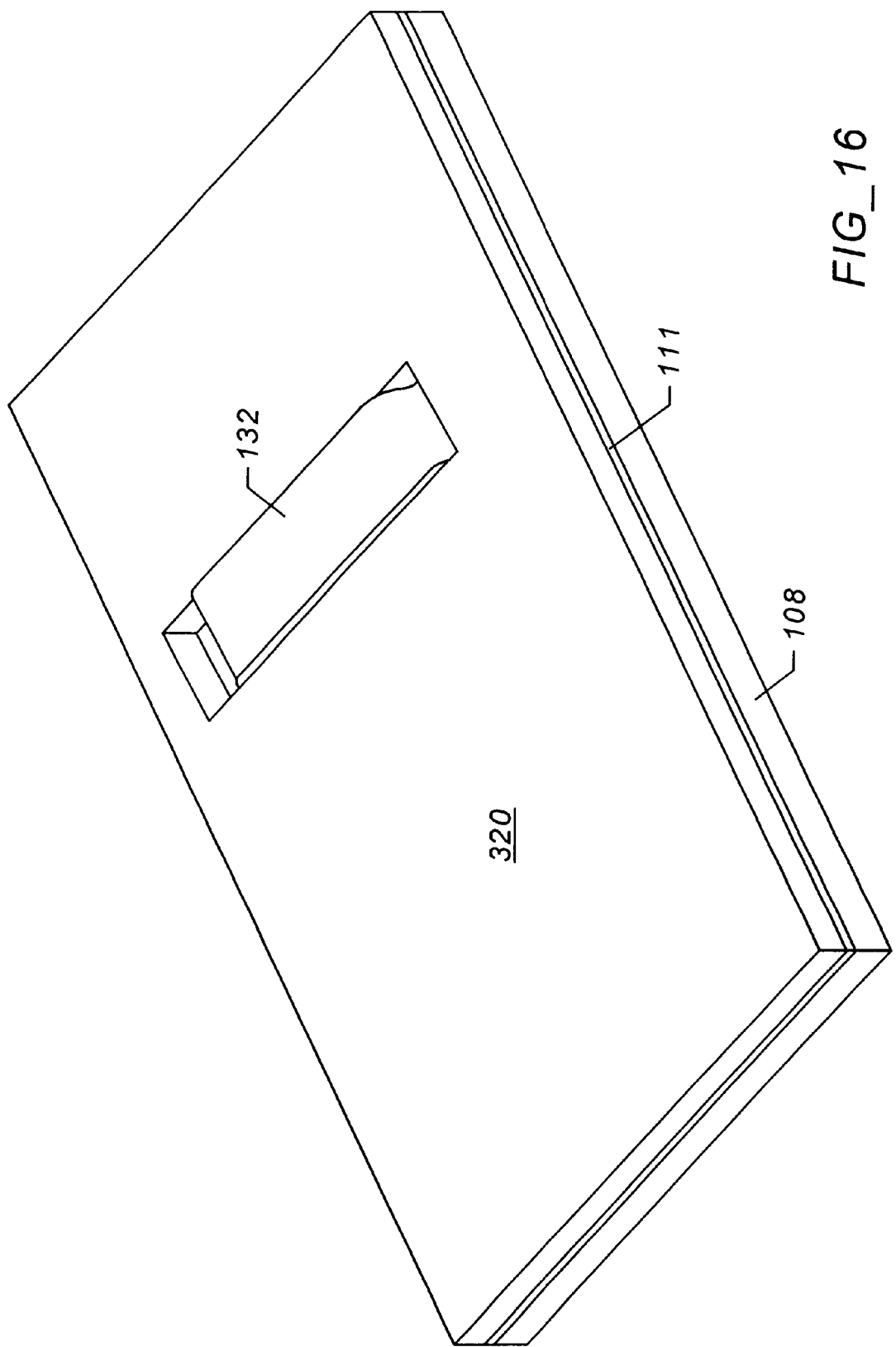
FIG_16

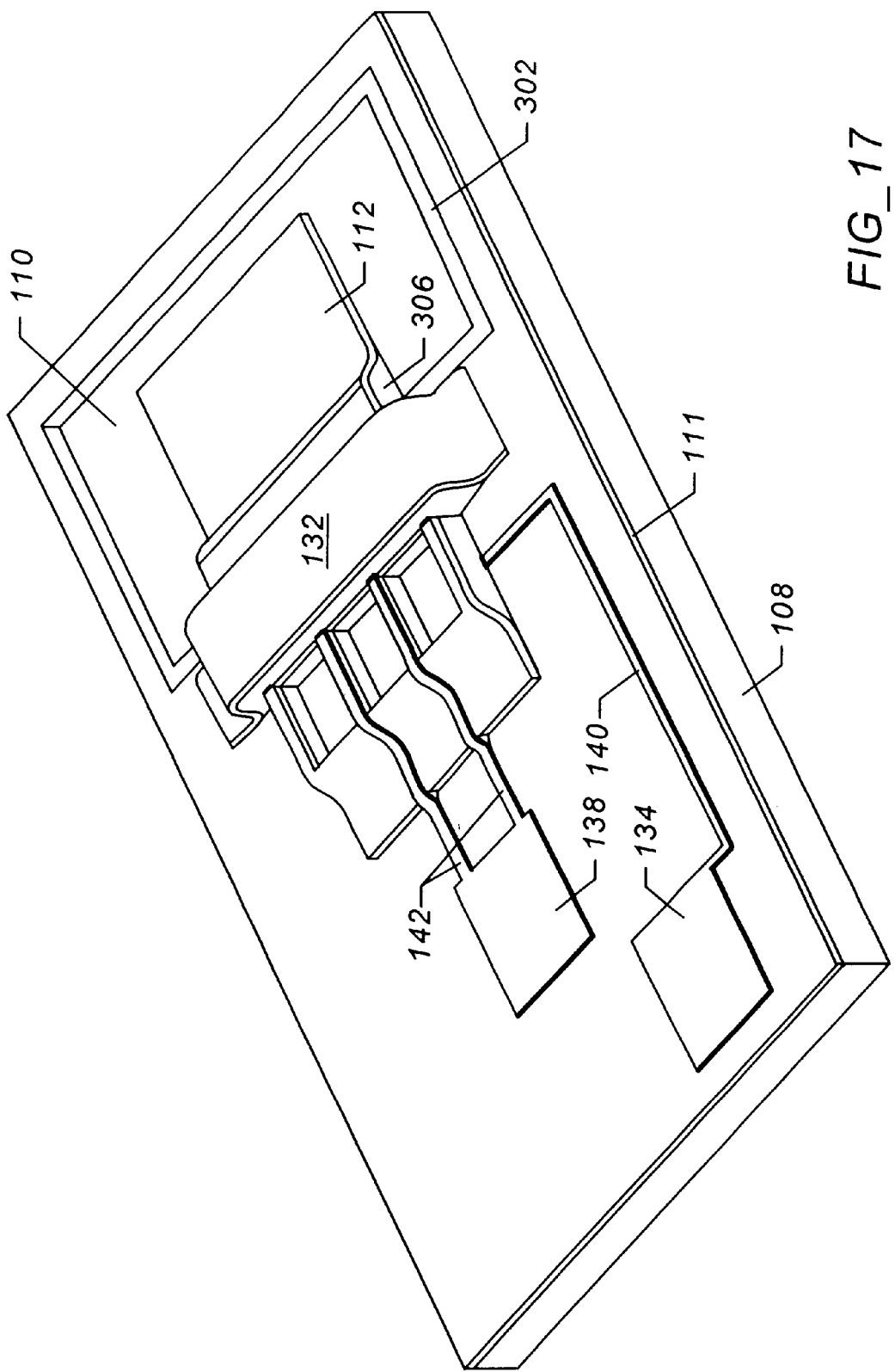
FIG_17

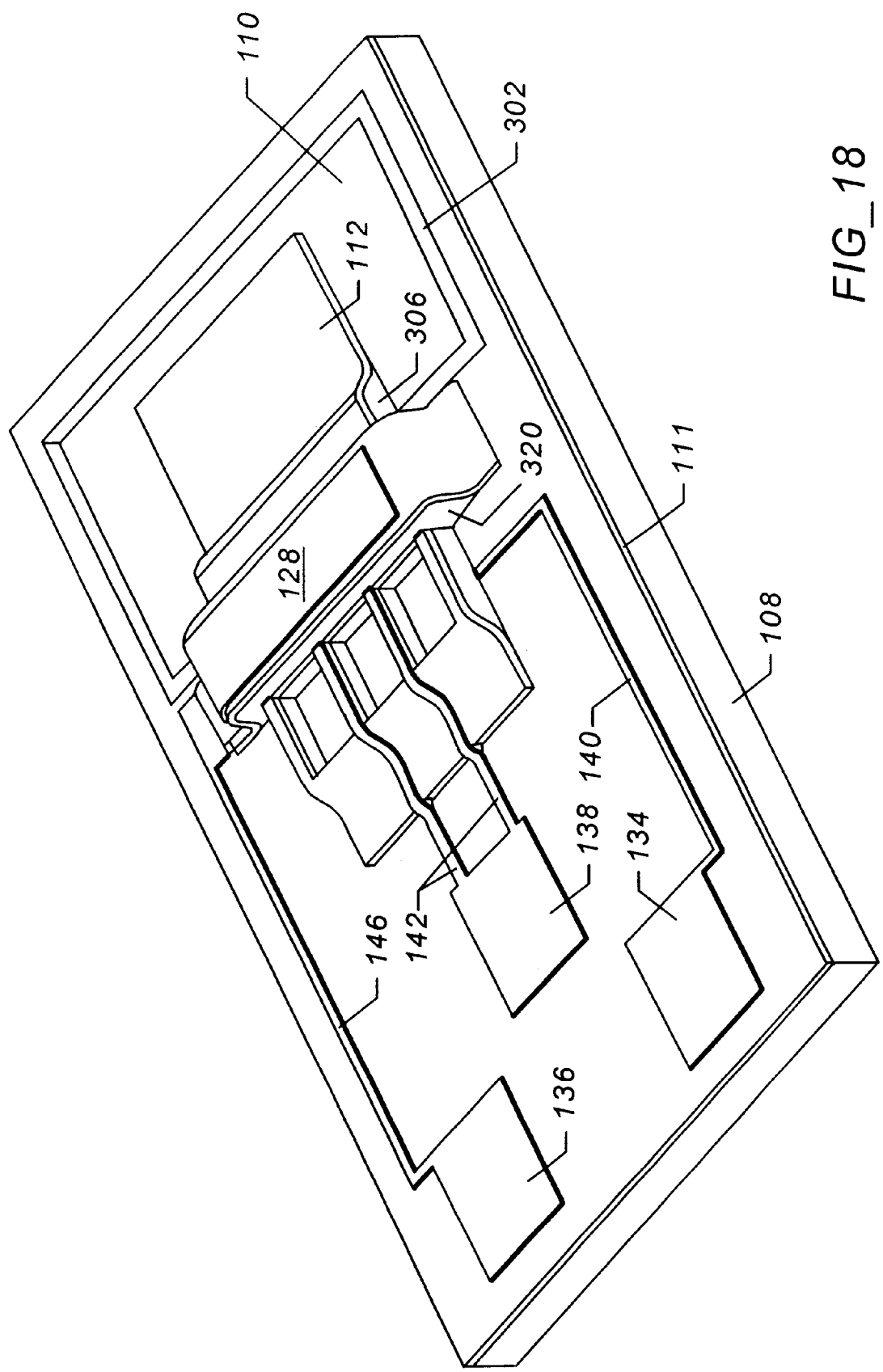
FIG_18

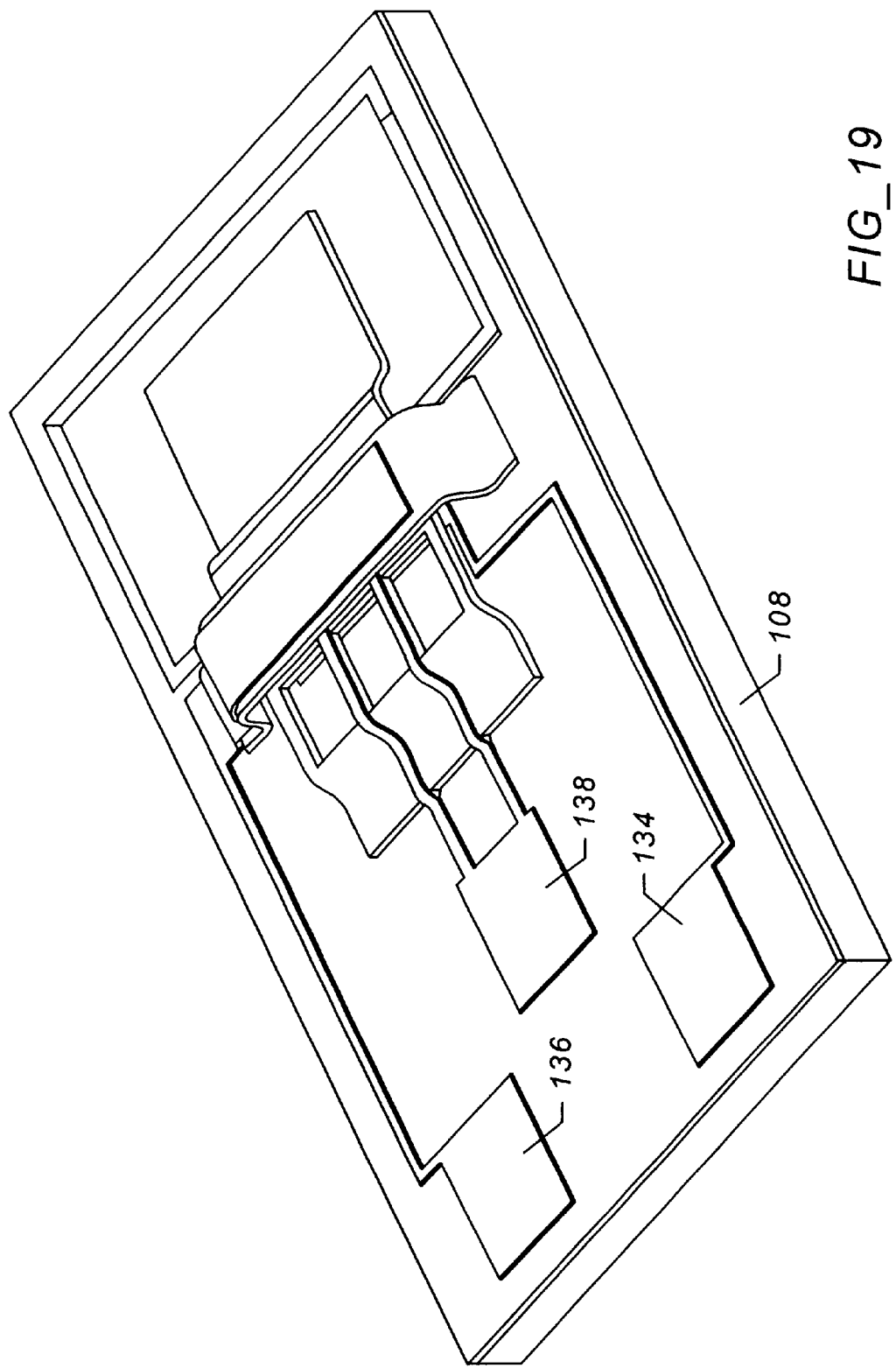
FIG_19

METHOD OF MANUFACTURING A VIBRATIONAL TRANSDUCER

This application claims the benefit of U.S. Provisional Application No. 60/052,040 filed Jul. 9, 1997.

BACKGROUND OF THE INVENTION

1. Field of the Invention

The present invention relates generally to the field of implantable vibrational transducers, such as those used for correcting hearing impairment, and more particularly, to methods for fabricating such transducers using microfabrication processes and transducers produced by such processes.

The seemingly simple act of hearing is a thing that can easily be taken for granted. Although it seems to us as humans we exert no effort to hear the sounds around us, from a physiologic standpoint, hearing is an awesome undertaking. The hearing mechanism is a complex system of levers, membranes, fluid reservoirs, neurons and hair cells which must is all work together in order to deliver nervous stimuli to the brain where this information is compiled into the higher level perception we think of as sound.

As the human hearing system encompasses a complicated mix of acoustic, mechanical and neurological systems, there is ample opportunity for something to go wrong. Unfortunately this is often the case. It is estimated that one out of every ten people suffer some form of hearing loss. Surprisingly, many patients who suffer from hearing loss take no action in the form of treatment for the condition. In many ways hearing is becoming more important as the pace of life and decision making increases as we move toward an information based society. Unfortunately for the hearing impaired, success in many professional and social situations may be becoming more dependent on effective hearing.

A number of auditory system defects are known to impair or prevent hearing. To illustrate such defects, a schematic representation of part of the human auditory system is shown in FIG. 1. The auditory system is generally comprised of an external ear AA, a middle ear JJ, and an internal ear FF. The external ear AA includes the ear canal BB and the tympanic membrane CC, and the internal ear FF includes an oval window EE and a vestibule GG which is a passageway to the cochlea (not shown). The middle ear JJ is positioned between the external ear and the middle ear, and includes an eustachian tube KK and three bones called ossicles DD. The three ossicles DD: the malleus LL, the incus MM, and the stapes HH, are positioned between and connected to the tympanic membrane CC and the oval window EE.

In a person with normal hearing, sound enters the external ear AA where it is slightly amplified by the resonant characteristics of the ear canal BB. The sound waves produce vibrations in the tympanic membrane CC, part of the external ear that is positioned at the distal end of the ear canal BB. The force of these vibrations is magnified by the ossicles DD.

Upon vibration of the ossicles DD, the oval window EE, which is part of the internal ear FF, conducts the vibrations to cochlear fluid (not shown) in the inner ear FF thereby stimulating receptor cells, or hairs, within the cochlea (not shown). Vibrations in the cochlear fluid also conduct vibrations to the round window (not shown). In response to the stimulation, the hairs generate an electrochemical signal which is delivered to the brain via one of the cranial nerves and which causes the brain to perceive sound.

The vibratory structures of the ear include the tympanic membrane, ossicles (malleus, incus, and stapes), oval window, round window, and cochlea. Each of the vibratory structures of the ear vibrates to some degree when a person with normal hearing hears sound waves. However, hearing loss in a person may be evidenced by one or more vibratory structures vibrating less than normal or not at all.

Some patients with hearing loss have ossicles that lack the resiliency necessary to increase the force of vibrations to a level that will adequately stimulate the receptor cells in the cochlea. Other patients have ossicles that are broken, and which therefore do not conduct sound vibrations to the oval window.

The hearing impaired patient today has a wide variety of hearing devices to choose from. Devices that have improved circuits, enhanced fitting parameters that allow the electronics to be customized to the patients individual hearing loss (i.e., similar to an eye glass prescription, one size does not fit all). New devices located completely in the patients ear canal are available that are cosmetically superior to the large bulky devices of years past and can be virtually invisible. Many manufacturers participate in the hearing marketplace which is a sizable 3 billion dollar worldwide market.

Prostheses for ossicular reconstruction are sometimes implanted in patients who have partially or completely broken ossicles. These prostheses are designed to fit snugly between the tympanic membrane CC and the oval window EE or stapes HH. The close fit holds the implants in place, although gelfoam is sometimes packed into the middle ear to guard against loosening. Two basic forms are available: total ossicular replacement prostheses which are connected between the tympanic membrane CC and the oval window EE; and partial ossicular replacement prostheses which are positioned between the tympanic membrane and the stapes HH. Although these prostheses provide a mechanism by which vibrations may be conducted through the middle ear to the oval window of the inner ear, additional devices are frequently necessary to ensure that vibrations are delivered to the inner ear with sufficient force to produce high quality sound perception.

Various types of hearing aids have been developed to restore or improve hearing for the hearing impaired. With conventional hearing aids, sound is detected by a microphone, amplified using amplification circuitry, and transmitted in the form of acoustical energy by a speaker or another type of transducer into the middle ear by way of the tympanic membrane. Often the acoustical energy delivered by the speaker is detected by the microphone, causing a high-pitched feedback whistle. Moreover, the amplified sound produced by conventional hearing aids normally includes a significant amount of distortion.

A recent breakthrough in the field of hearing impairment treatment is described in U.S. Pat. Nos. 5,554,096; 5,559,358; and 5,624,376, each of which is assigned to the assignee of the present application. These patents describe the use of floating mass transducers which may be implanted or mounted externally for producing vibrations in the vibratory structures of the ear. The floating mass transducers include a housing which may be vibrationally coupled to the vibratory structure within the ear, a mass mechanically coupled to the housing, and some means for vibrating the mass in response to an externally generated signal. Vibration of the mass, in turn, causes inertial vibration of the housing to produce the desired vibrations in the vibratory structure of the ear. The use of floating mass transducers for stimulating the vibratory structures of the ear has a number of advantages over other implantable devices. In particular, floating mass transducers can produce vibrations in the cochlea that have sufficient force to stimulate hearing perception with minimal distortion.

As described in these three patents, and in the co-pending applications which are listed below and also assigned to the assignee of the present application, the floating mass transducers are small devices composed of a number of discreet components which are attached to each other by conventional techniques, usually by hand construction. A first generation device being produced by the assignee of the present invention comprises a housing, and a magnet, a spring mechanism carrying the magnet, and a magnetic coil within the housing. Each of these components is placed in a metal housing, typically by hand, and the housing sealed and electrical leads brought out of the housing, also by hand. The method of fabrication is time-consuming, expensive, and presents a chance of human error in constructing the device. For these reasons, it would be desirable to provide improved fabrication methods for producing floating mass transducers for use in implantable devices for the treatment of hearing impairment and other purposes. It would be particularly desirable if such fabrication methods could be performed with little or no direct manual manipulation of the transducer components. It would be still further desirable if multiple copies of the transducers could be fabricated simultaneously. It would be even more desirable if such multiple transducers could be produced with highly accurate and repeatable specifications and tolerances. At least some of these objectives will be met by various aspects of the present invention, as described below.

2. Description of the Background Art

Micromachined transducers for the measurement of pressure and force are described in U.S. Pat. Nos. 5,559,358; 5,553,506; 5,473,944; 5,458,000; 5,338,929; and 5,165,289. Implantable vibratory transducers for mounting on the vibrating structures of the middle ear are described in U.S. Pat. Nos. 5,456,654; 5,554,096; and 5,624,376, assigned to the assignee of the present application. U.S. Pat. No. 5,624,376 describes an angular momentum mass magnet (FIG. 12) and a piezoelectric floating mass transducer (FIG. 13), each of which employ vibrating members which are anchored at one end. The following U.S. Patents contain related subject matter: U.S. Pat. Nos. 5,857,958; 5,949,895; 5,913,815; 5,800,336; 6,024,717; 5,795,287; 5,859,916; and 5,897,486. The full disclosures of each of these patents and pending applications are incorporated herein by reference.

SUMMARY OF THE INVENTION

The present invention provides unique vibrational transducers and methods for their fabrication. The vibrational transducers are miniaturized, typically having a maximum dimension below 3 mm, preferably below 2 mm, and are particularly suitable for medical uses. An exemplary medical use comprises direct or indirect attachment to a vibratory structure of an ear for the treatment of hearing impairment in human patients. Other medical uses include the transfer of sound energy to tissue surfaces and/or drugs for the enhancement of drug delivery, and the like. The vibrational transducers of the present invention will also be useful for non-medical uses, such as electrostatic converters.

The vibratory transducers of the present invention are particularly suitable for fabrication by micromachining or photolithographic techniques. Surprisingly, despite the design constraints resulting from the use of such fabrication techniques, the transducers of the present invention may be miniaturized, typically having a maximum dimension below those set forth above, while possessing the internal components necessary to produce a minimum displacement of at least 0.1 $\mu$m, preferably at least 0.5 $\mu$m, more preferably at least 1 $\mu$m, and even more preferably at least 3 $\mu$m, with useful ranges from 0.1 $\mu$m to 10 $\mu$m, usually from 1 $\mu$m to 5 $\mu$m, with a force sufficient to stimulate the vibratory structures within the ear to produce the perception of hearing in the patient.

In a first embodiment of the apparatus of the present invention, the transducers comprises a housing having an anchor region and a vibratory void therein. A vibrating member has a fixed end secured to the anchor region within the housing and a moving end which carries an inertial mass in the vibratory void within the housing. Means are provided for vibrating the moving end of the vibrating member in response to an applied electric signal so that vibrational force is transmitted to the anchor region of the housing. Usually, the housing will be sealed and be proportioned and adapted to be mounted on a vibratory structure of an ear for the treatment of hearing impairment. In such cases, a connector will usually be provided on the housing for attaching the housing to an ossicle of the middle ear or other vibratory structure. Optionally, a biocompatible coating may be provided over the exterior surface of the housing.

As described in more detail below, all portions of the vibratory transducer will usually be fabricated by photolithographic deposition, patterning, and etching processes. Thus, the vibrating member will be formed by a deposition process onto the anchor region of the housing. More usually, the housing will comprise a substrate, typically a silicon wafer, and the vibratory member will be formed by depositing a suitable bendable material, such as silicon nitride, thereover. Other components of the transducer will also be formed by deposition of the materials into the desired pattern, although it would also be possible to introduce some discrete components (i.e. components prepared separately from the photolithographic fabrication process) into the structure of the transducer.

Preferably, the vibrating member will comprise a beam having a hinge region to define a bending point. Usually, the hinge region will comprise a weakened region to define a solid hinge. In such cases, silicon nitride or other high Q materials are particularly preferred material for the beam since it can withstand a virtually unlimited number of vibrational cycles without material failure. It will also be possible, however, to form a mechanical hinge in the beam by surface micromachining techniques. The mechanical hinge would have the advantage of a very low natural frequency. The mechanical hinge, however, is generally more complicated to fabricate. Even when using a solid hinge, such as a thin region within the beam, it is desirable that the vibrating member in combination with the inertial mass have a natural frequency below 2000 Hz, preferably below 1500 Hz. In this way, the resonant characteristics of the beam will not interfere with vibrating the beam within the desired acoustic range, typically from 200 Hz to 10,000 Hz, when the transducer is used for treatment of hearing impairment.

The means for vibrating the vibrating member typically comprises an electrically conductive element on the vibrating member and at least one electrically conductive element fixed relative to the housing. By applying an electrical signal between the two electrically conductive elements, the vibrating member can be driven to vibrate the inertial mass and produce the desired inertial vibratory force. Usually, the vibrating means will further comprise a second electrically conductive element fixed relative to the housing. In the preferred embodiment, the two electrically conductive elements which are fixed relative to the housing are aligned over and under the electrically conductive element on the vibrating member. The upper and lower electrically conductive members can then be alternately driven in order to produce the desired vibratory pattern in the vibrating member. When using only a single electrically conductive pad fixed relative to the housing, the cantilever will have to possess a sufficient spring force to allow it to react after it has been driven. Such spring-loaded cantilever will generally possess much poorer frequency response than will comparable systems where the hinge has a very low spring force when driven.

In a second aspect of the apparatus of the present invention, an implantable vibrational transducer comprises a sealed housing having a generally planar base structure defining an anchor region and a vibrational void adjacent to the anchor region. A cantilever beam is mounted within the housing and has a fixed end secured to the anchor region and a free end which typically extends to or over the vibrational void. An inertial mass is secured to the free end of the cantilever beam and is disposed to vibrate in the vibrational void. An electrically conductive element is formed on the cantilever beam between the fixed end and the free end, and at least a first electrically conductive drive element is fixed relative to the housing and disposed adjacent to and spaced-apart from one side of the electrically conductive element on the beam. Thus, by applying an electrical signal between the drive element and the beam element, the beam will cause to vibrate the inertial mass and transmit an inertial force back to the housing. The housing of the implantable vibrational transducer is preferably proportioned and adapted to be mounted on a vibratory structure of the ear, and usually comprises a connector adapted for attaching to an ossicle or other vibratory structure. The housing may further comprise a biocompatible coating over its exterior surface, and the housing will typically be composed of at least in part of silicon and the cantilever beam will typically be composed at least in part of silicon nitride.

In a preferred embodiment of the implantable vibrational transducer, the cantilever beam is adapted to act as a spring having a natural frequency, in combination with the inertial mass, below 2000 Hz. The cantilever beam will typically comprise a weakened region to define a solid hinge, having the preferred natural frequency, alternatively, the cantilever beam could comprise a mechanical hinge having a very low natural frequency, typically approaching zero. In such cases, an electronic driver for the transducer (described in more detail below) can be adapted to provide electrical biasing of the free end of the cantilever beam in order to provide an "electronic spring." In all cases, the inertial mass will typically have a mass in the range from 3 mg to 50 mg, preferably from 5 mg to 15 mg.

In a further preferred aspect of the implantable vibrational transducer, the vibrational void will be defined at least in part by a recess formed in the base structure. The inertial mass is preferably disposed at least partly within the recess, and a clearance between the inertial mass and a wall of the recess will typically be in the range from 3 $\mu$m to 30 $\mu$m, preferably from 3 $\mu$m to 10 $\mu$m, when the mass is at rest relative to the base structure. This clearance is between the adjacent surfaces which move relative to each other when the mass is vibrated. Thus, the clearance provides the necessary room for the mass to vibrate when it is being electrically driven.

In an exemplary embodiment of the implantable vibrational transducer, the cantilever beam is composed of silicon nitride, has a length in the range from 0.5 mm to 2.5 mm, preferably from 1 mm to 2 mm, a width in the range from 0.2 mm to 2 mm, preferably from 0.5 mm to 1 mm, and a thickness in the range from 0.01 mm to 0.5 mm, preferably from 0.01 mm to 0.1 mm. The inertial mass will have a mass in the range set forth above, with a volume in the range from 0.1 mm$^3$ to 2 mm$^3$, preferably from 0.1 mm$^3$ to 0.5 mm$^3$. Thus, the mass will typically be formed from a dense metal, such as gold, silver, platinum, or the like. The geometry of the implantable vibrational transducer may vary widely, and it may be in the form of a cylindrical solid, rectangular solid, triangular solid, or it may have an irregular configuration. Typically, at least one face will be flat since the device will normally be formed from a planar silicon wafer starting material, as described below. In the case of rectangular solids, the length will typically be in the range from 1 mm to 4 mm, preferably from 1.5 mm to 2.5 mm, the width will be in the range from 1.5 mm to 3 mm, preferably from 1.5 mm to 2 mm, and the thickness will be in the range from 1.5 mm to 2.5 mm, preferably from 1.5 mm to 2 mm.

The implantable vibrational transducers of the present invention will preferably be configured so that the inertial mass will have a maximum vibrational displacement in the range from 1 $\mu$m to 100 $\mu$m, preferably from 1 $\mu$m to 30 $\mu$m, when the mass is vibrated within the expected range, typically the auditory range from 200 Hz to 10,000 Hz. The cantilever beam will typically be driven with a power ranging from 10 $\mu$watts to 200 $\mu$watts, preferably from 10 $\mu$watts to 50 $\mu$watts. The vibrational energy will depend on the power at which it is being driven.

According to the present invention, a method for fabricating a vibrational transducer comprises providing a base structure, typically in the form of a silicon wafer or other conventional material suitable for microfabrication, e.g. photolithographic processing. A cantilever beam is formed on a surface of the base structure, typically by deposition, and is patterned into a desired geometry. The cantilever beam will be anchored at one end to the base structure and will have a free end which is capable of vibrating relative to the base structure. An inertial mass is formed at the free end of the cantilever beam, and the inertial mass is disposed to vibrate in a free space. An electrically conductive drive element is formed on the cantilever beam in the space between the anchored end and the free end. A fixed electrically conductive drive element is also formed on or over the base structure so that it is adjacent to and spaced-apart from the electrically conductive element on the cantilever beam. Preferably, a second electrically conductive drive element is also formed on or over the base structure, with the exemplary embodiment comprising a first drive element on the base structure and a second drive element formed on a bridge over the cantilever beam. A housing is then formed over the base structure to seal the transducer so that it is suitable for implantation or other uses.

Preferably, the fabrication method further comprises forming a recess in the base structure to define at least a portion of the free space in which the inertial mass vibrates. The inertial mass may be formed within the recess, typically by first forming a sacrificial layer, then depositing the inertial mass material into the recess (over the sacrificial layer) and subsequently removing the sacrificial layer to provide a clearance between the inertial mass and the wall of the recess within the base structure. Preferably, the clearance will be in the range from 1 $\mu$m to 100 $\mu$m, preferably from 1 $\mu$m to 30 $\mu$m, which is sufficient to permit the desired vibrational amplitude described above.

In a further preferred aspect of the fabrication method of the present invention, the cantilever beam is formed by depositing a layer which extends from an anchor region on the base structure over a bridge structure defined by a sacrificial layer, and then on to the previously formed inertial mass (which will typically be in the recess). Subsequently, the sacrificial layer is removed to leave clearance for the cantilever being to vibrate together with the inertial mass. Preferably, at least one aperture will be etched into the cantilever beam to define a weakened hinge region. Further preferably, the cantilever beam will comprise silicon nitride which is deposited and patterned to have the dimensions set forth above.

The electrically conductive drive elements are preferably formed by depositing and patterning electrically conductive material on the substrate below the electrically conductive element on the beam. A bridge is then formed over the cantilever beam, and a second electrically conductive pad deposited and patterned on the bridge. In this way, the preferred stack of electrically conductive pads described above may be formed, with both pads fixed relative to the base structure.

BRIEF DESCRIPTION OF THE DRAWINGS

FIG. 1 is a schematic representation of a portion of the human auditory system.

FIG. 2 is a representation of the human auditory system, as in FIG. 1, further showing the attachment of a floating mass transducer to an incus of the middle ear. Such attachment of a floating mass transducer to the incus is known in the prior art and is representative of a variety of ways in which the floating mass transducer of the present invention may be coupled to the vibratory structures of the ear.

FIGS. 2A–2F illustrate different possible locations of the vibratory transducers of the present invention for vibrating a vibratory structure of the ear.

FIG. 3 illustrates an exemplary embodiment of a vibratory transducer constructed according to the principle of the present invention.

FIG. 4 illustrates the transducer of FIG. 3, with portions broken away.

FIG. 5 is a cross-sectional view taken along line 5—5 of FIG. 4.

FIGS. 6–19 are isometric views illustrating the sequential fabrication steps of an exemplary method for producing the vibratory transducers of the present invention using photolithographic patterning, material deposition, and selective material etching processing steps.

DESCRIPTION OF THE SPECIFIC EMBODIMENTS

The present invention provides an improved floating mass transducer of a type which will be useful for implantation or external attachment to a vibratory structure of the ear for treatment of hearing impairment in human patients. The vibratory transducers are miniaturized and particularly suitable for implantation within the middle ear and for attachment to or insertion between the vibratory structures present in the ear. Preferably, the vibratory transducers will have a total weight below 50 mg, more preferably below 25 mg, with a maximum dimension at or below the values set forth above. The total volume of transducers will typically be below 3 mm$^3$, preferably below 2 mm$^3$. Despite this small size and low weight, the vibratory transducers will be able to produce sufficient inertial displacement and inertial displacement force to stimulate a patient's auditory system to produce the perception of sound. Moreover, the frequency response characteristics of the vibratory transducers are capable of accurately producing sounds which are detected by a separate microphone component and provided to the vibratory transducer, typically by transcutaneous wires as described in more detail below. The vibratory transducers are preferably produced by micromachining processes, such as photolithographic patterning, material deposition, selective material etching, and the like, such as are commonly used in the semiconductor manufacturing industry.

The exemplary vibratory transducers comprise four essential components. First, a housing defines an interior space having an anchor region and a vibrational void therein. A vibratory element, such as a cantilever beam, is disposed within the housing and has a first, fixed end secured to the anchor region and a second, moving or free end. An inertial mass is connected to the moving or free end of the vibratory member, and vibration of the mass through the vibrating member produces the desired inertial forces which may be transmitted to the auditory system through the housing. The vibratory transducer will further include means for vibrating the vibrating member in response to an applied electric signal. Typically, the electric signal will drive the vibrating member at frequencies within the normal human auditory range, e.g. 200 Hz to 10,000 Hz. Preferably, the vibrating member will have a natural frequency which is below the frequency at which it is to be driven, e.g. below 2000 Hz in the case of vibratory transducers being used intended for implantation or mounting within a patient's auditory system. In this way, the vibrating member will have a very flat response within the range at which it is intended to be driven. In particular, the vibratory member will not resonate at its normal operating frequency, and the inertial force output will correspond closely to the electric signal input.

For the treatment of hearing impairment, the vibratory transducers of the present invention may be connected to any suitable microphone that is capable of detecting ambient sounds and converting those sounds into electrical signals suitable for driving the vibratory transducer. Typically, the microphone will comprise or be connected to a power source, e.g. a battery, which provides sufficient energy for operation of the microphone as well as driving of the vibratory transducer by the microphone output. In order to drive the vibratory transducers of the present invention, an AC output having a voltage in the range from 3 V to 50 V, and current in the range from 0.003 mA to 1 mA, will normally be sufficient. It will be appreciated, of course, that certain signal modifying and conditioning of circuitry could be built into the vibratory transducer so that the external signal fed to the transducer could fall outside of the ranges described above. In general, the nature of capabilities of the microphone is outside of the scope of the present invention, and suitable microphones can be obtained from commercial suppliers, such as Knowles Electronics, Inc., Isaca, Ill.

Referring now to FIGS. 2A–2F, a variety of different placements for the vibratory transducers 100 of the present invention within the middle ear and/or on the tympanic membrane are described. These figures also suggest different placements for the microphone structure or system which is used to provide the drive signal to the vibratory transducer 100. It will be appreciated that, for the most part, each of the different transducer placements can be combined with the different microphone structures in still further combinations to permit use of the vibratory transducer 100 for the treatment of hearing impaired patients. Each of the vibratory transducers/microphone placements illustrated in FIGS. 2A–2F have been previously described in co-pending application Ser. No. 08/582,301, the full disclosure of which has previously been incorporated herein by reference.

The transducer 100 may be affixed to various structures within the ear. FIG. 2A shows a transducer 100 attached to an incus MM by a biocompatible clip 102 which is secured to a face 104 of the housing and which at least partially surrounds the incus MM. The clip 102 holds the transducer firmly to the incus so that the vibrations of the housing which are generated during operation are conducted along the bones of the middle ear to the oval window EE of the inner ear and ultimately to the cochlear fluid as described above. An exemplary clip 102, shown in FIG. 3, includes a pair of titanium prongs 106 which have a substantially arcuate shape and which may be crimped tightly around the incus.

The transducer 100 may be connected to any of the vibratory structures of the ear. The transducer should be mechanically isolated from the bone and tissue in the surrounding region since these structures will tend to absorb the mechanical energy produced by the transducer. For the purposes of this description, the surrounding region consists of all structures in and surrounding the external, middle, and internal ear that are not the vibratory structures of the ear.

Instead of employing external clips 102, the transducer 100 could be provided with an opening or aperture (not shown) which would permit the transducer to be implanted directly over a portion of the stapes HH. Such implantation could be accomplished by separating the stapes HH from the incus MM and slipping the aperture of the transducer 100 over the stapes HH. The separated ossicles would then be returned to their natural position, and the connective tissue between them would heal over time to provide the necessary reconnection. It would also be possible to provide such mounting for the transducer 100 over the stapes, although it would be necessary to make sure that the vibratory direction of the transducer is suitable for stimulating the incus. Such mounting is shown in FIG. 2B.

The transducers 100 of the present invention may also be used as part of an ossicular replacement procedure. As shown in FIG. 2C, a total ossicular replacement prosthesis may be comprised of a pair of members 38, 40 connected to opposed faces of the transducer 100. The transducer 100 is positioned between the tympanic membrane CC and the oval window EE and is preferably of sufficient length to be held into place by friction.

Referring to FIG. 2D, a transducer 100 may be used in a partial ossicular replacement together with a pair of members 38c, 40c connected to opposed faces of the transducer and positioned between the incus MM and the oval window EE.

FIG. 2E shows a schematic representation of a transducer 100 and related components positioned within a patient's skull PP. An external sound transducer 200, which may be substantially identical in design to a conventional hearing aid transducer, comprises a microphone, sound processing unit, amplifier, battery, and external coil (not shown). The external sound transducer 200 is positioned on the exterior of the skull PP. A subcutaneous coil transducer 28 is connected to the leads 24 of the transducer 100 and is typically positioned under the skin behind the ear such that the external coil is positioned directly over the location of the subcutaneous coil 28.

Sound waves are converted to an electrical signal by the microphone and sound processor of the external sound transducer 200. The amplifier boosts the signal and delivers it to the external coil which subsequently delivers the signal to the subcutaneous coil 28 by magnetic induction. Leads 24 conduct the signal to transducer 100 through a surgically created channel CT in the temporal bone. When the alternating current signal representing the sound wave is delivered to the coil 14 in the vibratory transducer 100, the vibratory member and inertial mass are driven in a manner which produces the desired vibratory forces, as described below.

Because one end of the vibratory member is rigidly attached to the housing, the housing will vibrate in the direction indicated by the double headed arrow in FIG. 2E. The vibrations are conducted via the stapes HH to the oval window EE and ultimately to the cochlear fluid.

The vibratory transducer 100 of the present invention may also be attached to the tympanic membrane in the external ear. FIG. 2F illustrates the transducer 100 attached to the tympanic membrane. In particular, the transducer 100 is attached to the malleus LL through the tympanic membrane CC with a clip 402. The transducer 100 could also be attached to the tympanic membrane by other methods including screws, sutures, adhesives, and the like. The transducer 100 receives alternating current via leads 24 which run along the ear canal to a pickup coil 404.

An external sound transducer 406 is positioned behind the concha QQ. The external sound transducer 406 is substantially identical in design to a conventional hearing aid transducer and is comprised of a microphone, sound processing unit, amplifier, and battery, none of which are depicted in detail. Sound waves are converted to an electrical signal by the microphone and sound processor of the external sound transducer. The amplifier boosts the signal and delivers it via leads 408 to a driver coil 410. Leads 408 pass from the back of the concha to the front of the concha through a hole 412. The leads could also be routed over the concha or any one of a number of other routes. The driver coil is adjacent to the pickup coil so there are actually two coils within the ear canal.

The driver coil delivers the signal to pickup coil 404 by magnetic induction. The pickup coil produces an alternating current signal on leads 24 which the vibratory transducer translates into a vibration in the middle ear as described earlier. Although this implementation has been described as having driver and pickup coils, it may also be implemented with a direct lead connection between the external sound transducer and the floating mass transducer.

An obvious advantage of this implementation is that surgery into the middle ear to implant the transducer is not required. Thus, the patient may have the transducer attached to an ossicle without the invasive surgery necessary to place the transducer in the middle ear.

Referring now to FIG. 3, the vibratory transducer 100 suitable for implantation within a patient's middle ear and attachment to the incus or other bone structure is illustrated. The transducer 100 is shown as having a generally rectangular configuration, with a length, width, and thickness, generally in the ranges set forth above. Transducer 100 is preferably hermetically sealed, i.e. sealed against the intrusion of moisture, cellular material, bacteria, and the like, to reduce the likelihood that it will cause infection when implanted in the middle ear. Electrical leads 24 are brought out through a sealed passage in the housing of the vibratory transducer, where the housing comprises a base structure 108 and a cover 110. An insulating layer 112 is disposed between the base structure 108 and cover 110 and results from the preferred fabrication method of the present invention, as will be described in more detail below.

Referring now to FIGS. 4 and 5, the vibratory transducer 100 comprises an inertial mass 110 which is attached to and suspended from a free end of vibrating member 112. The inertial mass 110 is disposed in a recess 114 which is formed in the base structure 108 and which provides sufficient clearance for the inertial mass to vibrate relative to the base structure. The vibrating member 112 is preferably in the form of a cantilever beam having a fixed end 116 secured to an anchor region on base structure 108 (through the insulating layer, 111). The vibrating member 112 includes a hinge region 118 which is formed by three apertures 120 (best observed in FIG. 12) which cause preferential bending of the member in the four remaining struts 122. The hinge region 118 could also be formed by thinning the material of the vibrating member 112 over a line or path which extends across the member. In both cases, such hinge regions will be "solid hinges" in that they rely on bending of a solid material to permit vibration of the vibrating member 112. It will also be possible to provide mechanical hinges which permit substantially undamped articulation of the free end of the vibrating member 112 relative to the fixed end 116. The hinges can be formed by known techniques, such as surface micromachining.

The vibrating member 112 is driven by a pair of electrically conductive pads 126 and 128 which are disposed on opposite sides of a third electrically conductive pad 130 which is formed on the vibrating member 112. The lower electrically conductive pad 126 is formed directly over the insulating layer 112 of the base structure 108. The upper electrically conductive pad 128 is formed on a separate bridge structure 132 which extends over an upper surface of the vibrating member 112. The electrically conductive pad 130, an example of an electrically conductive element, on the vibrating member 112 is disposed between, and preferably equidistance from, each of the electrically conductive pads 126 and 128, examples of electrically conductive drive elements. The areas of each pad will typically be in the range from 0.05 mm$^2$ to 0.3 mm$^2$, preferably from 0.1 mm$^2$ to 0.2 mm$^2$, and the spacing therebetween will be between 1 $\mu$m to 30 $\mu$m, preferably between 3 $\mu$m to 10 $\mu$m. Each of the electrically conductive pads 126, 128, and 130 will be brought out to a corresponding attachment pad 134, 136, and 138 which in turn may be connected to the external leads 24 (FIG. 3) by wire bonding or other conventional connection methods.

Fabrication of the vibrational transducers 100 of the present invention will preferably be accomplished using photolithographic fabrication techniques of the type generally employed in the semiconductor industry. Conveniently, the materials used will also be those employed in the semiconductor industry, e.g. silicon (e.g. for the base structure), silicon nitride (for the insulating layer and/or the vibrating member), polysilicon and/or electrically conductive metals (for the electrically conductive layers and pads), and the like. The use of these materials, however, is merely for convenience, and it would be possible to employ other materials for at least portions of the transducers produced by the methods of the present invention.

Referring now to FIG. 6, the transducers 100 may be produced beginning with a conventional silicon wafer, such as a double-polished silicon wafer having a 100 crystalline orientation. It will be appreciated that many transducers may be produced from a single silicon wafer, where the processing steps for forming the various components of the transducer are produced in parallel. Preferably, 100, 500, or more transducer devices may be produced from a single wafer and a single fabrication protocol employing the steps described hereinafter. For convenience, however, FIGS. 6 to 19 illustrate only a single device being fabricated, which corresponds to the transducer produced after dicing the wafer into the individual devices.

In FIG. 6, the silicon wafer in the form of base structure 104 has had the insulating layer deposited thereon. Conveniently, the insulating layer 110 may be a silicon nitride or sputtered silicon monoxide deposited with a thickness of about 2,000 Å. A first conductive layer is then deposited over the insulating layer 112, e.g. polysilicon or a metal deposited to a thickness of about 500 Å, and the layer is then patterned by conventional photolithographic techniques into the lower electrically conductive pad 126, the connector pad 134, and a trace 140 extending therebetween, as shown in FIG. 6.

The structure shown in FIG. 6 is then overcoated with silicon nitride, typically to a thickness of about 2,000 Å, and the silicon nitride layer patterned to permit plasma etching to form an opening 300 in the first insulating layer 111, as shown in FIG. 7. The opening 300 defines the peripheral dimensions of a recess 114 which is formed in the base structure 108 by an anisotropic etch using an etchant such as potassium hydroxide or tetramethylamoniumhydroxide, as shown in FIG. 8.

A sacrificial layer 302 is then deposited and patterned in the recess 114 to a thickness of approximately 3 $\mu$m. The sacrificial layer is usually formed from polyimide or silicon nitride, and will be deposited over the entire wafer surface prior to selective removal from all portions of the surface, except within the recess 114, as shown in FIG. 9.

The inertial mass structure 110 is next formed within the recess 114 over the sacrificial layer 302, as shown in FIG. 10. The inertial mass structure 110 will typically be formed from a relatively dense material, preferably gold, by electroplating into the remaining volume of the recess over the sacrificial layer 302. The exposed surface of the gold will then be polished to a planar condition, using conventional techniques.

A second sacrificial layer 306, typically having a thickness of about 3 $\mu$m, is then deposited over the wafer, as illustrated in FIG. 11. The sacrificial layer 306 is then patterned using conventional photolithographic techniques to form openings 308 and 310. The openings 308 and 310, together with a remaining portion 312 of the sacrificial layer 306 therebetween, will define the geometry for depositing the vibrating member 112. In particular, as shown in FIG. 12, a silicon nitride layer is deposited over the wafer, typically to a thickness of about 5 $\mu$m, so that it attaches to the upper surface of insulating layer 111 through opening 308 and to the upper surface of the inertial mass structure 110 through opening 310. The silicon nitride layer is removed from other portions of the wafer so that only the vibrating member 112 remains. Preferably, apertures 120 are formed in the silicon nitride by conventional photolithographic patterning and etching techniques. This leaves the struts 122 which define the hinge region 118 of the vibrating member 112, as described previously.

The second sacrificial layer 306 is then removed, leaving only that portion of the layer which is protected beneath the vibrating member 112, as shown in FIG. 13. At this point in the processing, a portion of the first sacrificial layer 302 remains beneath the inertial mass structure 110 and a portion of the second sacrificial layer 306 remains beneath the vibrating member 112.

Electrically conductive pads 130 and 138 are formed over the vibrating member 112 and upper surface of insulating layer 111, as illustrated in FIG. 14. The electrically conductive pads are formed by depositing a second conductive layer over the entire wafer and subsequently patterning the conductive layer using conventional photolithographic techniques. Typically, the second electrically conductive layer, which defines the pads 130 and 138 as well as the conductive traces 142 therebetween, will be polysilicon or a suitable metal.

A third sacrificial layer 320 is formed over the top of the wafer layer, as illustrated in FIG. 15. The sacrificial layer 320 is patterned to provide a pair of openings 322 and 324 which will serve to form the depending legs of the bridge structure 132, as best observed in FIG. 16. The bridge structure 132 is preferably formed from a layer of silicon nitride, typically having a thickness of about 5 $\mu$m, which is first applied to the total wafer area, and then patterned and etched back to leave the structure shown in FIG. 16. The third sacrificial layer is then removed, as shown in FIG. 17, leaving only a portion of the third sacrificial layer 320 beneath the bridge structure 132.

Electrically conductive pad 128 and the corresponding connector pad 136 are then formed, as shown in FIG. 18. As before, the wafer is covered with a suitable conductive material, such as polysilicon or metal, and the electrically conductive layer patterned by conventional photolithographic techniques to leave the pads 128 and 136 as well as a connecting trace 146 therebetween.

The remaining portions of the sacrificial layers 302, 306, and 320 are then removed using a wet or dry isotropic etch. Preferably, the wafer is diced prior to removing the sacrificial layers, and the resulting structures, as shown in FIG. 19, may be freeze-dried to remove moisture, if necessary.

The necessary electrical connections are then made to the pads 134, 136, and 138 and a cover 109 (FIG. 3) formed over the base structure 108. Conveniently, the cover 109 may be formed by attachment of a separate component, deposition of a biocompatible metal such as gold, and/or by coating with a biocompatible polymer adhesive. The resulting vibratory transducers 100 are suitable for implantation within or mounting on the vibratory structures of an ear by any of the methods described above.

Although the foregoing invention has been described in some detail by way of illustration and example, for purposes of clarity of understanding, it will be obvious that certain changes and modifications may be practiced within the scope of the appended claims.

What is claimed is:

1. A method for fabricating a vibrational transducer, said method comprising:

providing a base structure;

forming a cantilever beam anchored at one end on the base structure;

forming an inertial mass on a free end of the cantilever beam, wherein the inertial mass is disposed to vibrate in a free space;

forming an electrically conductive element on the beam between the anchored end and the free end;

forming an electrically conductive drive element disposed adjacent to, opposite of, and spaced-apart from the electrically conductive element on the cantilever beam, wherein said electrically conductive drive element is fixed relative to the base structure; and forming a housing over the base structure.

2. A method as in claim 1, wherein the base structure is composed at least partly of silicon.

3. A method as in claim 1, further comprising forming a recess in the base structure to provide at least a portion of the free space in which the inertial mass will vibrate.

4. A method as in claim 3, wherein the inertial mass is formed within the recess by first forming a sacrificial layer, then depositing the inertial mass material, and subsequently removing the sacrificial layer to leave clearance for vibration of the inertial mass.

5. A method as in claim 4, wherein the clearance is in the from 1 $\mu$m to 100 $\mu$m.

6. A method as in claim 5, wherein the inertial mass has a mass in the range from 3 mg to 100 mg.

7. A method as in claim 1, wherein the cantilever beam forming step comprises depositing a layer which is anchored to the base structure, extends over a bridge defined by a sacrificial layer, and attached to the inertial mass, wherein the sacrificial layer is subsequently removed to leave clearance for the cantilever beam to vibrate.

8. A method as in claim 7, further comprising etching at least one aperture into the cantilever beam to define a weakened hinge region.

9. A method as in claim 7, wherein the cantilever beam layer comprises silicon nitride, wherein the beam is deposited and patterned to have a length in the range from 0.5 mm to 2.5 mm, a width from 0.2 mm to 2 mm, and a thickness from 0.01 mm to 0.5 mm.

10. A method as in claim 1, wherein the electrically conductive drive element forming step comprises:

depositing and patterning a first electrically conductive pad over the base structure on a region below the electrically conductive element on the beam;

forming a bridge over the cantilever beam; and depositing and patterning a second electrically conductive pad on the bridge, wherein the first and second electrically conductive pads are aligned so that an electrical signal applied between the pads will vibrate the cantilever beam.

* * * * *